United States Patent
Hamelin et al.

(10) Patent No.: US 11,418,220 B2
(45) Date of Patent: Aug. 16, 2022

(54) METHOD, SYSTEM, AND APPARATUS FOR A SEGMENTED POLARIZATION-ADJUSTED CONVOLUTIONAL (PAC) CODE

(71) Applicants: Louis-Philippe Hamelin, Montreal (CA); Harsh Aurora, Montreal (CA); Yiqun Ge, Kanata (AO)

(72) Inventors: Louis-Philippe Hamelin, Montreal (CA); Harsh Aurora, Montreal (CA); Yiqun Ge, Kanata (AO)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/825,319

(22) Filed: Mar. 20, 2020

(65) Prior Publication Data

US 2021/0297094 A1  Sep. 23, 2021

(51) Int. Cl.
| | |
|---|---|
| H03M 13/00 | (2006.01) |
| H03M 13/29 | (2006.01) |
| H04L 1/00 | (2006.01) |
| H03M 13/27 | (2006.01) |
| H03M 13/13 | (2006.01) |

(52) U.S. Cl.
CPC ....... *H03M 13/2933* (2013.01); *H03M 13/13* (2013.01); *H03M 13/2792* (2013.01); *H04L 1/0042* (2013.01); *H04L 1/0047* (2013.01); *H04L 1/0059* (2013.01); *H04L 1/0071* (2013.01)

(58) Field of Classification Search
None
See application file for complete search history.

(56) References Cited

U.S. PATENT DOCUMENTS

| 5,473,601 A | 12/1995 | Rosen et al. | |
|---|---|---|---|
| 2013/0117344 A1* | 5/2013 | Gross | H03M 13/1575 |
| | | | 708/490 |

(Continued)

FOREIGN PATENT DOCUMENTS

| CN | 109462457 A | 3/2019 |
|---|---|---|
| WO | 9845970 A1 | 10/1998 |
| WO | 2018129526 A1 | 7/2018 |

OTHER PUBLICATIONS

E. Arikan, "Channel Polarization: A Method for Constructing Capacity-Achieving Codes for Symmetric Binary-Input Memoryless Channels," IEEE Transactions on Information Theory, vol. 55, No. 7, 2009, pp. 3051-3073.

(Continued)

*Primary Examiner* — Mujtaba M Chaudry

(57) ABSTRACT

A codeword is generated based on a segmentation transform and a Polarization-Assisted Convolutional (PAC) code that includes an outer convolutional code and a polar code, and based on separate encoding of respective different segments of convolutionally encoded input bits according to the polar code. Each segment of the respective segments includes multiple bits of the convolutionally encoded input bits for which the separate encoding of the segment is independent of the separate encoding of other segments. Separate decoding may be applied to segments of such a codeword to decode convolutionally encoded input bits corresponding to the separately encoded segments of the convolutionally encoded input bits.

20 Claims, 18 Drawing Sheets

(56) References Cited

U.S. PATENT DOCUMENTS

| | | | |
|---|---|---|---|
| 2015/0293716 A1* | 10/2015 | Jiang | G06F 11/1012 |
| | | | 711/154 |
| 2017/0366199 A1* | 12/2017 | Ge | H04L 1/0053 |
| 2017/0366204 A1* | 12/2017 | Shi | H04L 25/061 |
| 2018/0076929 A1 | 3/2018 | Zhang et al. | |
| 2018/0145702 A1* | 5/2018 | Feygin | H01L 22/20 |
| 2018/0183464 A1 | 6/2018 | Ge | |
| 2019/0140784 A1* | 5/2019 | Xi | H04L 1/1845 |
| 2019/0305887 A1* | 10/2019 | Jang | H04L 1/0057 |
| 2019/0312676 A1* | 10/2019 | Jeong | H04L 1/0041 |
| 2020/0177211 A1* | 6/2020 | Fazeli Chaghooshi | |
| | | | H03M 13/458 |
| 2020/0412385 A1* | 12/2020 | Arikan | H03M 13/13 |

OTHER PUBLICATIONS

Tal and Vardy, "List Decoding of Polar Codes", Proceedings of the 2011 IEEE International Symposium on Information Theory, Jul. 2011, 11 pages.

R. Pedarsani, "Polar Codes: Construction and Performance Analysis", Jun. 2011, EPFL master project, 48 pages.

J.Dai, K.Niu, Z.Si, J.Lin, "Evaluation and Optimization of Gaussian Approximation for Polar Codes", May 2016, 4 pages.

E. Arikan, "From Sequential Decoding to Channel Polarization and Back Again", Aug. 2019, 10 pages.

Mori R, Tanaka T., "Performance and Construction of Polar Codes on Symmetric Binary-Input Memoryless Channels", IEEE International Symposium on Information Theory, 2009, pp. 1496-1500.

R1-1611254, "Details of the Polar Code Design", Huawei & HiSilicon, 3GPP TSG RAN WG1 Meeting #87, Nov. 10-14, 2016, 33 pages.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \leftarrow 102$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \leftarrow 104$$

FIG. 1

METHOD, SYSTEM, AND APPARATUS FOR A SEGMENTED POLARIZATION-ADJUSTED CONVOLUTIONAL (PAC) CODE

FIELD

The present disclosure relates to generally to communications and, in particular, to segmented Polarization-Adjusted Convolutional (PAC) codes and coding.

BACKGROUND

Polar codes are proposed as channel codes for use in future wireless communications, and have been selected for uplink and downlink enhanced Mobile Broadband (eMBB) control channel coding for the new 5th Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation (SC) decoding and its extensions (e.g., SC List decoding) are effective and efficient options for decoding polar coded information.

Polar codes employ channel polarization to theoretically reach channel capacity. Polarization refers to a coding property that, as code length increases to infinity, bit-channels (also referred to as sub-channels) polarize and their capacities approach either zero (completely noisy channel) or one (completely perfect channel). In other words, bits encoded in high capacity sub-channels will experience a channel with high Signal-to-Noise Ratio (SNR), and will have a relatively high reliability or a high likelihood of being correctly decoded, and bits encoded in low capacity sub-channels will experience a channel with low SNR, and will have low reliability or a low possibility to be correctly decoded. The fraction of perfect bit-channels is equal to the capacity of this channel.

Improved channel codes or channel coding methods are generally desired. While improvements to conventional polar codes and to other channel codes have been proposed, even more improvements are possible to benefit encoding and decoding performance.

SUMMARY

Illustrative embodiments are disclosed herein by way of example.

According to one aspect of the present disclosure, a method involves generating a codeword based on a segmentation transform and a PAC code that comprises an outer convolutional code and a polar code, and based on separate encoding of respective different segments of convolutionally encoded input bits according to the polar code. Such a method also involves transmitting the codeword. Each segment of the respective segments includes multiple bits of the convolutionally encoded input bits for which the separate encoding of the segment is independent of the separate encoding of other segments.

Another aspect of the present disclosure relates to a non-transitory processor-readable medium storing instructions which, when executed by one or more processors, cause the one or more processors to perform such a method.

According to another aspect, an apparatus includes a processor and a memory coupled to the processor. The memory stores instructions which, when executed by the processor, cause the processor to perform such a method. As described above by way of example, the method may involve: generating a codeword based on a segmentation transform and a PAC code that comprises an outer convolutional code and a polar code, and based on separate encoding of respective different segments of convolutionally encoded input bits according to the polar code, with each segment of the respective segments comprising a plurality of the convolutionally encoded input bits for which the separate encoding of the segment is independent of the separate encoding of other segments; and transmitting the codeword.

An apparatus consistent with a further aspect of the present disclosure includes an encoder and a transmitter. The encoder is configured to generate a codeword based on a segmentation transform and a PAC code that comprises an outer convolutional code and a polar code, and based on separate encoding of respective different segments of convolutionally encoded input bits according to the polar code. Each segment of the respective segments includes multiple bits of the convolutionally encoded input bits for which the separate encoding of the segment is independent of the separate encoding of other segments. The transmitter is coupled to the encoder, to transmit the codeword.

Decoding embodiments are also disclosed. For example, a decoding method may involve receiving a codeword based on a codeword that was generated as described above, based on a segmentation transform and a PAC code that comprises an outer convolutional code and a polar code, and based on separately encoding respective different segments of convolutionally encoded input bits according to the polar code, with each segment of the respective segments including multiple bits of the convolutionally encoded input bits for which the separate encoding of the segment is independent of the separate encoding of other segments. Such a method may also involve separately decoding segments of the received codeword to recover segments of convolutionally encoded input bits corresponding to the separately encoded segments of the convolutionally encoded input bits, and decoding the convolutionally encoded input bits recovered from the received codeword.

A non-transitory processor-readable medium may store instructions which, when executed by one or more processors, cause the one or more processors to perform such a decoding method.

Another aspect of the present disclosure relates to an apparatus that includes a processor and a memory coupled to the processor. The memory stores instructions which, when executed by the processor, cause the processor to perform such a decoding method.

An apparatus according to a still further aspect of the present disclosure includes a receiver and a decoder. The receiver is configured to receive a codeword based on a codeword that was generated based on a segmentation transform and a PAC code that comprises an outer convolutional code and a polar code and based on separately encoding respective different segments of convolutionally encoded input bits according to the polar code. Each segment of the respective segments includes multiple bits of the convolutionally encoded input bits for which the separate encoding of the segment is independent of the separate encoding of other segments. The decoder is coupled to the receiver, to separately decode segments of the received codeword to recover segments of convolutionally encoded input bits corresponding to the separately encoded segments of the convolutionally encoded input bits, and to decode the convolutionally encoded input bits recovered from the received codeword.

Other aspects and features of embodiments of the present disclosure will become apparent to those ordinarily skilled in the art upon review of the following description.

BRIEF DESCRIPTION OF THE DRAWINGS

Examples of embodiments will now be described in greater detail with reference to the accompanying drawings.

FIG. 1 is a diagram showing one example of how a polar coding generator matrix can be produced from a kernel.

DETAILED DESCRIPTION

FIG. 1 is a diagram showing, by way of an illustrative example, how a polar coding generator matrix can be produced from a kernel $G_2$ 100. Note that FIG. 1 is an example. Other forms of kernel are also possible.

A polar code can be formed from a Kronecker product matrix based on a seed matrix $F=G_2$. For a polar code having codewords of length $N=2^m$, the generator matrix is $G_2^{\otimes m}$. The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

Figures 2, 3:
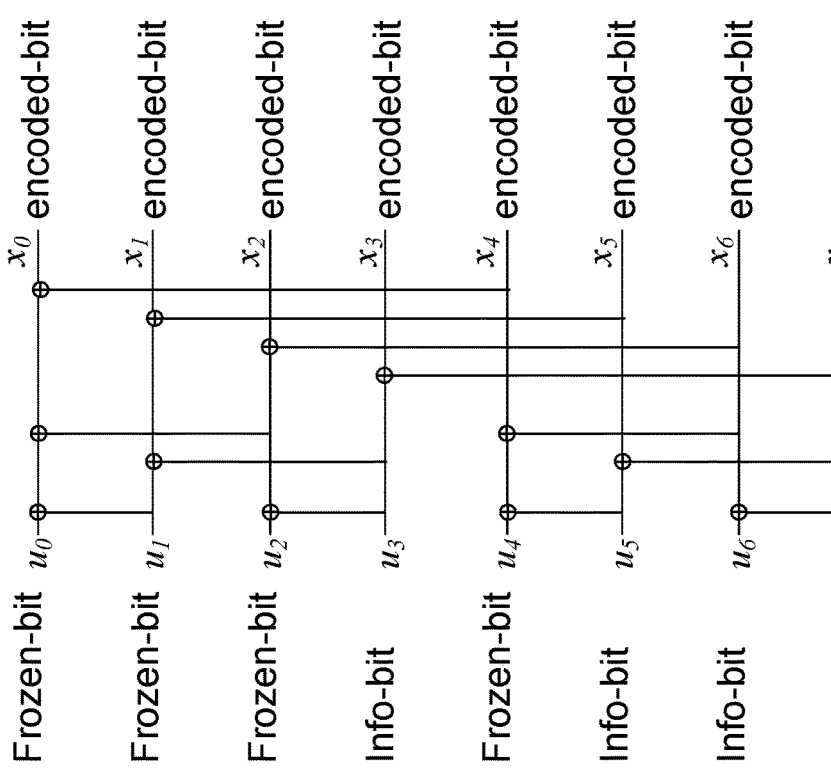
FIG. 2 shows an example use of a polar coding generator matrix for producing codewords.
FIG. 3 shows a schematic illustration of an example polar encoder.

FIG. 2 shows an example use of a polar coding generator matrix for producing codewords and FIG. 3 shows a schematic illustration of an example polar encoder. In FIG. 2, the generator matrix $G_2^{\otimes 3}$ 104 is used to produce codewords of length $2^3=8$. A codeword x is formed by the product of an input vector $u=[0\ 0\ 0\ u_3\ 0\ u_5\ u_6\ u_7]$ and the generator matrix $G_2^{\otimes 3}$ 104 as indicated at 200. The input vector u is composed of information bits and fixed or frozen bits. In the specific example shown in FIGS. 2 and 3, N=8, so the input vector u is an 8-bit vector, and the codeword x is an 8-bit vector. The input vector has frozen bits in positions 0, 1, 2 and 4, and has information bits at positions 3, 5, 6, and 7. An example implementation of an encoder that generates codewords is indicated in FIG. 3 at 212, where the frozen bits are all set to 0, and the circled "+" symbols represent modulo 2 addition. For the example of FIGS. 2 and 3, an N=8-bit input vector is formed from K=4 information bits and N−K=4 frozen bits. Codes of this form are referred to as polar codes and the encoder is referred to as a polar encoder. Decoders for decoding polar codes are referred to as polar decoders. Frozen bits are set to zero in the example shown in FIGS. 2 and 3. However, frozen bits could be set to other bit values that are known to both an encoder and a decoder. For ease of description, all-zero frozen bits are considered herein, and may be generally preferred.

As is known, polar coding may be performed with or without bit reversal. The example polar encoder in FIG. 3 is without bit reversal.

Generally, the output of a polar encoder can be expressed as $x_0^{N-1}=u_0^{N-1}G_N$, where, without bit reversal, $G_N=F^{\otimes n}$ is an N-by-N generator matrix, $N=2^n$, $n \geq 1$ (e.g. for n=1, $G_2=F$ (indicated as 100 in FIG. 1)). For bit reversal, $G_N=B_N F^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate or the Signal-to-Noise Ratio (SNR) of the physical channel. A reliability sequence (reliable and unreliable positions) could be calculated based on assumed or measured characteristics of the physical channel before the information is transmitted over the channel, for example. In theory, the frozen bits can be set to any value as long as the location of each frozen bit is known to both the encoder and the decoder. In conventional applications, the frozen bits are all set to zero.

With a sufficiently long code length, a code designed according to polarization theory can reach the channel capacity in a binary symmetric memoryless channel if a Successive Cancellation (SC) decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

During encoding, an N-bit input vector could be formed from K information bits, including optional cyclic redundancy check (CRC) bits, and (N−K) frozen bits. In this example, starting with a number of input bits, a CRC is calculated and appended to the input bits to produce a set of K information bits including the input bits and the CRC bits. The remaining (N−K) frozen bits are inserted to produce an N-bit input vector, where N is a power of 2 in an Arikan polar code. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including any CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit.

An extension of the SC polar decoding algorithm is known as List or SCL decoding. In a List decoder, successive levels of a binary decision tree are generated, each level corresponding to a decision on a respective unknown bit. Each (decoding) path in the decision tree from the root node to leaf nodes represents a possible partial decoded sequence of unknown bits and has a corresponding likelihood. Typically, during generation of the decision tree, at each level of the decision tree where the number of paths grows beyond a set threshold L, the L paths having the highest likelihoods are identified, and the remaining paths are discarded. Some List decoders may also make use of CRC bits included in the codeword to assist in decoding. For example, if the codeword includes encoded CRC bits for the previous information bits, then once the decision tree is generated, each of the surviving paths that corresponds to decoded information bits is checked against the CRC bits represented in each of those surviving paths. The decoder then outputs as a decoded vector the information bits in the surviving path that passes the CRC check.

Figure 4:
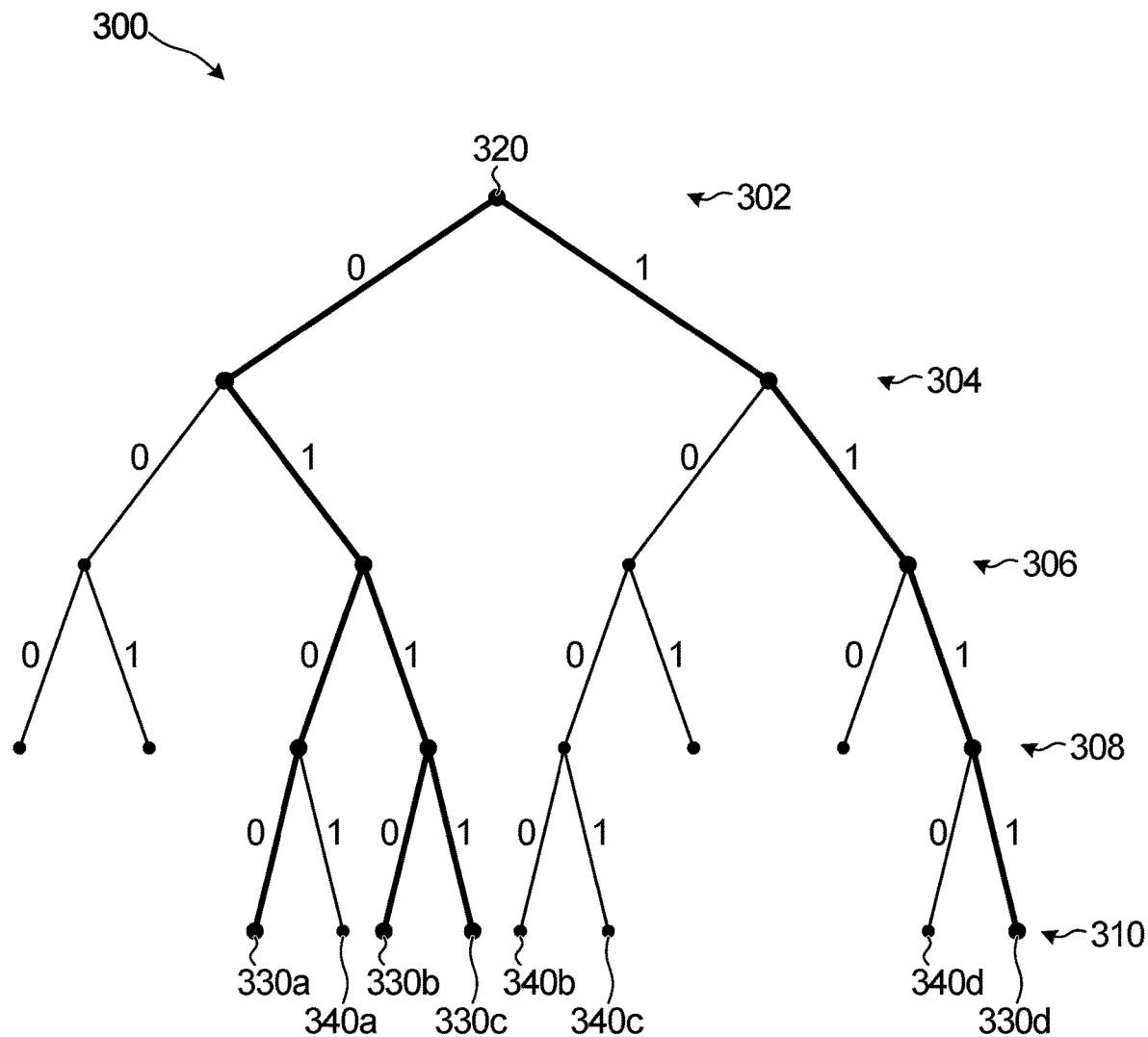
FIG. 4 is a diagram showing a portion of an example decision list tree whose width is limited by a maximum given list size and used in an SCL (Successive Cancellation List) polar decoder.

FIG. 4 is a diagram showing a portion of an example decision list tree 300 used in an SCL polar decoder, whose width is limited by a maximum given list size L. In FIG. 4 the list size L is 4. Five levels 302, 304, 306, 308, 310 of the decision tree are illustrated. Although five levels are illustrated, it should be understood that a decision tree to decode K information bits (including CRC bits) would have K+1 levels. At each level after the root level 302, each one of up to 4 surviving decoding paths is extended by one bit. The leaf or child nodes of root node 320 represent possible choices for a first bit, and subsequent leaf nodes represent possible choices for subsequent bits. The decoding path from the root node 320 to leaf node 330a, for example, represents an estimated codeword bit sequence: 0, 1, 0, 0. At level 308, the number of possible paths is greater than L, so L paths having the highest likelihood (e.g. best Path Metrics) are identified, and the remaining paths are discarded. The decoding paths that survive after the path sort at level 306 are shown in bold in FIG. 4. Similarly, at level 310, the number of possible paths is again greater than L, so the L paths having the highest likelihood (best PMs) are identified, and the remaining paths are again discarded. In the example shown, the paths terminating in leaf nodes 330a, 330b, 330c, and 330d represent the highest likelihood paths. The paths terminating in leaf nodes 340a, 340b, 340c, 340d are the lower likelihood paths which are discarded.

In an Additive White Gaussian Noise (AWGN) channel, a polar code in effect divides a channel into N sub-channels, where N is referred to as mother code length and is always a power of 2 in an Arikan polar code, which is based on a polar kernel that is a 2-by-2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to parity, CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 5:
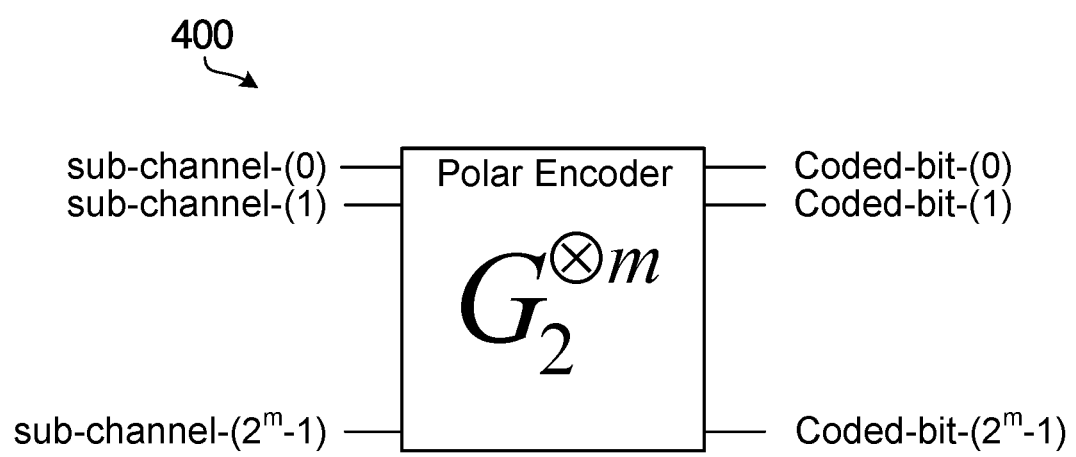
FIG. 5 is a block diagram illustrating an example of a polar encoder based on a 2-by-2 kernel.

Polar encoders based on Kronecker products of a 2-by-2 Arikan kernel $G_2$ are described above. FIG. 5 is a block diagram illustrating an example of a polar encoder 400 based on a 2-by-2 kernel. Sub-channels and coded bits are labeled in FIG. 5. A channel is divided into N sub-channels by a polar code as noted above. An information block and frozen bits are allocated onto the N sub-channels, and the resultant N-sized vector is multiplied with an N-by-N Kronecker matrix by the polar encoder 400 to generate a codeword that includes N coded bits. An information block includes at least information bits and could also include assistant bits such as CRC bits or parity check bits. A sub-channel selector (not shown) could be coupled to the polar encoder 400 to select sub-channels for information bits and any assistant bits, with any remaining sub-channels being frozen sub-channels. Sub-channel selection is based on reliabilities of the sub-channels, and typically the highest reliability sub-channels are selected as information sub-channels for carrying information bits.

For polar codes that are based on a 2-by-2 kernel and an N-by-N Kronecker matrix, N is a power of 2. This type of kernel and polar codes based on such a kernel are discussed herein as illustrative examples. Other forms of polarization kernels with a different size (or number of inputs) could be generally characterized by code length $N=D^n$, where D is the dimension (i.e., size or number of inputs) of the applied kernel. In addition, polarization kernels such as other prime-number kernels (e.g. 3-by-3 or 5-by-5) or combinations of (prime or non-prime number) kernels to produce higher-order kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching and/or other purposes for example.

The low minimum distance of polar codes for small to moderate size codewords, combined with low complexity SC decoding, may negatively affect performance. Therefore, new ideas to further exploit channel polarization and improve performance of polar codes are of interest.

A new class of code, referred to as a Polarization-Adjusted Convolutional (PAC) code, was proposed in E. Arikan, "From Sequential Decoding to Channel Polarization and Back Again", August 2019. With a PAC code, Arikan introduced an outer convolutional code prior to a polar transform to exploit the channel capacity of frozen-bit channels and achieve better code performance for small to moderate size codewords.

The Arikan PAC code uses a convolutional outer code to encode K information bits and N−K frozen bits and generates an N-bit output vector, and then applies an N-by-N polar transform to the convolutionally encoded data. Finally, an N-bit message is transmitted on a communication channel. At the decoder, the Arikan PAC code can be processed using a Fano decoding algorithm, for example. Using the same path metric as an SCL decoder, the decoder explores multiple decoding paths on the SC tree according to the Fano algorithm.

Arikan concludes that a PAC code is more sensitive to the frozen and information sub-channel selection than to the convolution polynomial. For an Arikan PAC code, a random convolution polynomial is acceptable as long as length of the polynomial is sufficiently large.

Although a PAC code can still be decoded with SC decoding, including SCL, SC-Flip, SC-Fano and other variants of SC-based decoding algorithms, PAC coding adds a new constraint to a decoding algorithm. At the encoder, message bits are sequentially processed by a convolutional encoder, starting with message bit #0 and ending with bit #N−1. The value of bit #x changes the state of the convolution encoder, and thus contributes to the encoding results of bits #x+1 to #N−1. At the decoder, the same bit sequence must be executed because the state of the convolutional decoder must include the estimated value of bits #0 to #x−1 before estimating the post-convolution value of bit #x.

Figure 6:
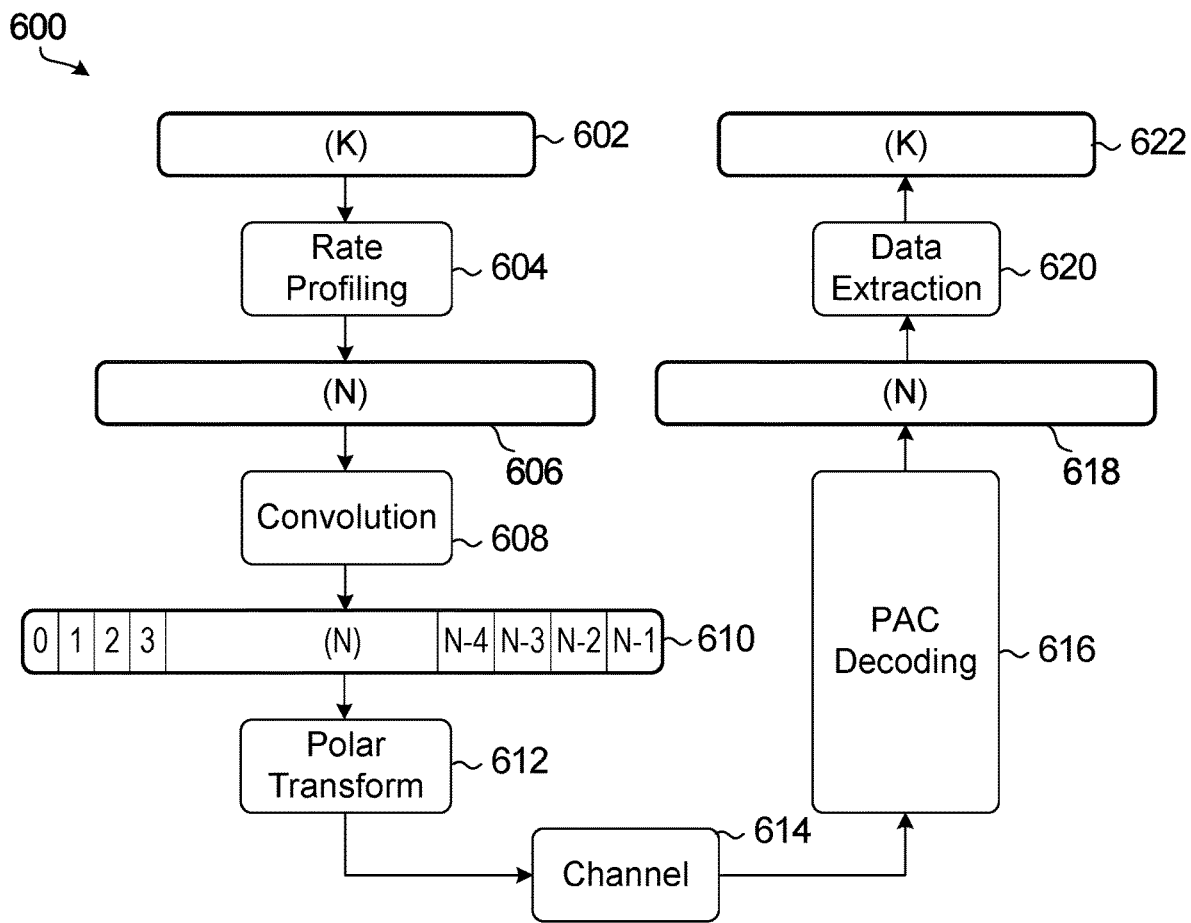
FIG. 6 is a block diagram illustrating PAC coding.

FIG. 6 is a block diagram illustrating a PAC coding scheme 600. PAC encoding includes rate profiling at 604, convolutional encoding at 608, and a polar transform at 612 using the following parameters: N (power-of-2 code length), K (information block length), A (score function to select K sub-channels to carry the message) and c (convolution polynomial).

The rate profiling operation at 604 involves selection of K sub-channels or indices of an N-bit codeword 606 and inserting the K-bit message 602 inside those K positions. The value of the remaining N−K positions are frozen sub-channels or positions and have a fixed known value, such as 0. As shown at 608, a one-to-one convolution operation, also referred to herein as convolutional encoding, follows the rate profiling at 604. The state of a convolutional encoder that is configured to perform convolutional encoding is re-initialized to 0 at the start of every codeword. All message bits are convolutionally encoded from bit #0 to #N−1 to generate N convolutionally encoded bits at 610. An N-by-N polar transform, based on the 2-by-2 polar code kernel in this example, is applied to the N-bit convoluted codeword 610 to generate a PAC-encoded message that is transmitted over a physical channel 614.

At a receiver, PAC decoding of a received word is performed at 616 to recover an N-bit message 618, from which K information bits 622 are extracted at 620.

Figure 7:
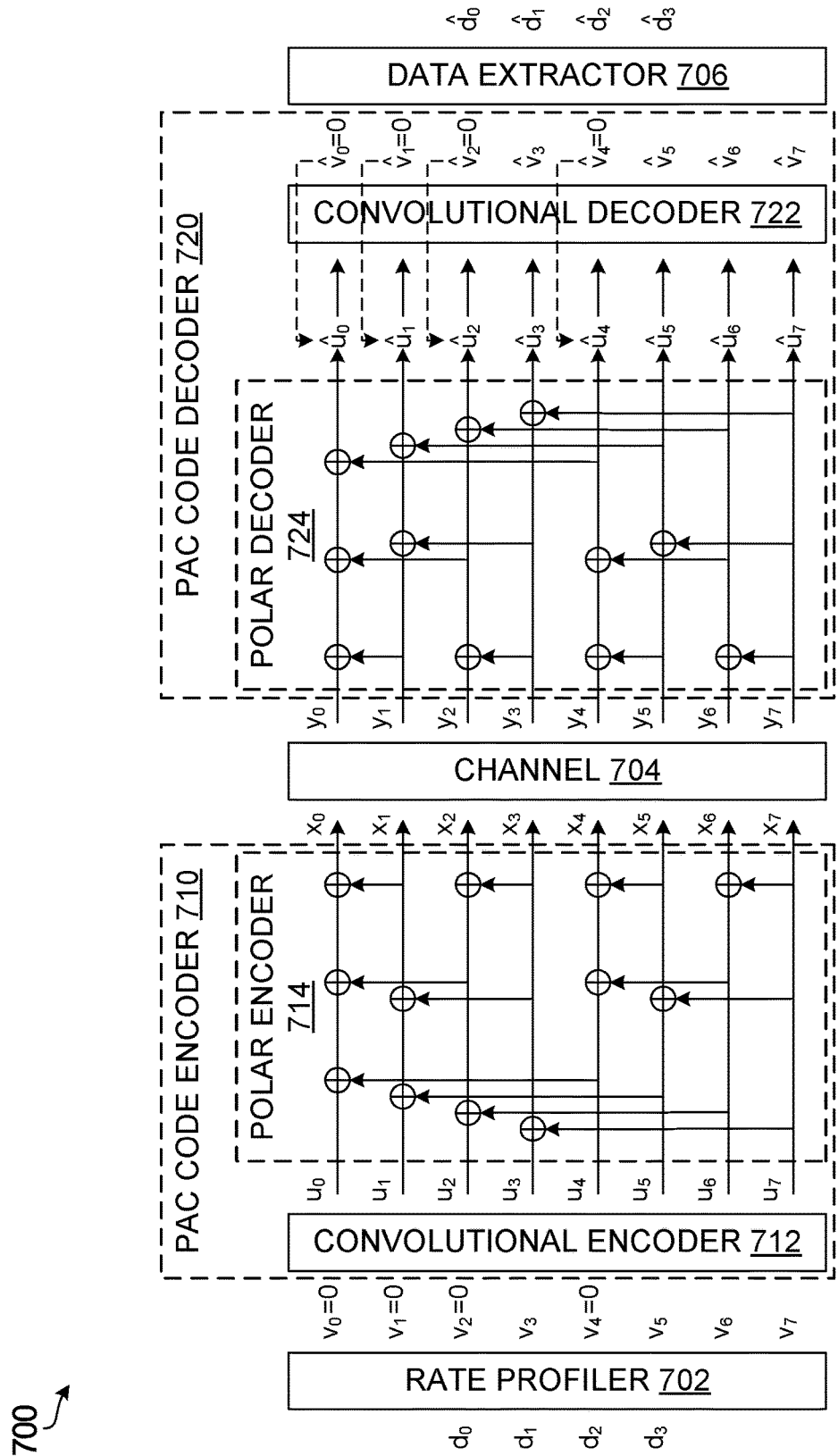
FIG. 7 is a block diagram illustrating a PAC coding system.

FIG. 7 is a block diagram illustrating a PAC coding system 700, which includes a rate profiler 702, a PAC code encoder 710, a channel 704, a PAC code decoder 720, and a data extractor 706. The PAC code encoder 710 includes a convolutional encoder 712 and a polar encoder 714, and the PAC code decoder 720 includes a polar decoder 724 and a convolutional decoder 722.

The system 700 implements an N=8, K=4, A={3, 5, 6, 7} PAC code. The PAC code encoder 710 and the PAC code decoder 720 each combine a polar transform stage, illustrated as the polar encoder 714 and the polar decoder 724, and a convolution stage, illustrated as the convolutional encoder 712 and the convolutional decoder 722. The post-convolution value of each frozen sub-channel is known a-priori, and is used by the PAC decoder 720 to measure the correctness of the decoding path. For a frozen bit position, which includes sub-channels 0, 1, 2, 4 in the example shown, the input value to the convolutional decoder 722 is predicted assuming the value of $\hat{v}_x=0$, where x=0, 1, 2, 4 for this example. If the actual value of $\hat{u}_x$ differs from the predicted value of $\hat{u}_x$, then the value of $\hat{u}_x$ is flipped to match the predicted value of $\hat{u}_x$ and the decoding path is penalized. The polar partial sum is then calculated by the polar decoder 724 with the predicted value of $\hat{u}_x$, or another fixed frozen bit value, before the value of $\hat{u}_{x+1}$ can be estimated. For an information bit position, the estimated value of $\hat{u}_y$, where y=3, 5, 6, 7 in the example shown, is fed from the polar decoder 724 to the convolution decoder 722 to generate the $\hat{v}_y$ value. An incorrect information bit estimated value for $\hat{u}_y$ will impact the following pre-convolution frozen bit prediction values and consequently the overall correctness of the decoding path.

Codeword decoding latency, decoder hardware complexity, and performance of a code are keys for a successful channel coding solution. Polar code performance improves as the code length increases. However, longer codewords increase decoding latency and require larger and more complex decoders. Therefore, it is generally desirable to have a high performance code with a short decoding latency achieved by a low complexity decoder.

According to an aspect of the present disclosure, segmentation is applied to PAC coding. Segmenting a long codeword may reduce decoding latency and improve hardware efficiency. For example, consider a non-segmented polar code with N=8 and K=4. An 8-by-8 polar transform is applied to an input vector that includes at least information bits and frozen bits to generate a codeword, and at a decoding side, an SC-based decoder sequentially recovers the input vector. As disclosed herein, an encoder may apply a segmentation transform, such as interleaving, a reverse polar transform, or potentially some other form of permutation, to an input vector to generate multiple segments that can be separately encoded according to a polar code. Constraints over the segmentation transform may be derived from the input vector to enable information bits to be estimated from bits that are decoded by separate segment decoding.

In the context of an N=8 polar code and segmentation into two segments, for example, separate N/2 polar encoding is performed on each segment to generate an 8-bit output vector that includes two distinct N/2-bit sub-codewords or segment codewords. These N/2-bit sub-codewords have their own respective channel LLR inputs (ŷ), and because of segmentation, the two sub-codewords can share the same decoder and be processed sequentially, or each sub-codeword can have its own decoder for parallel decoding. After the separate length N/2 decoding, the recovered segments are combined back together and the original information block is recovered.

Similarly to parity check (PC) polar codes, the outer convolutional code of a PAC code introduces a "selfchecking" capability that can be used in a decoder to measure correctness of a decoding path. Also, with segmentation, the continuation of the state of a convolutional decoder across consecutive segments acts as a form of "cross-checking" capability between segments.

Segmentation of PAC codes as disclosed herein is compatible with existing SC-based decoding algorithms, such as SC, SCL, SC-Fano, Fast-SSC, and other variants of SC-based decoding algorithms.

In comparison to N-based decoding, decoding of two sub-codewords of length N/2 involves a lower complexity decoder implementation. Depending on the decoding algorithm, complexity saving can reach 50% in this example of two segments.

The decoding latency of N/2-bit sub-codewords may also be less than the decoding latency of an N-bit codeword with the same or a similar code rate.

Generally speaking, coding design and coding systems sized for N-bit codewords also work for shorter codewords have a length smaller than N.

Given a set of parameters (K, N, A, c), where K is the information block length, N is the power-of-two mother code length, A is the set of indices to carry the information block, and c is the convolution impulse response (polynomial), PAC code construction for an N-bit codeword can be segmented in two sub-codewords of length N/2. These sub-codewords are associated with two segments, and are referred to herein as segment #0 and #1 codewords for ease of reference. At the decoder, the N/2-bit segment #0 and #1 codewords are processed by one or more decoders either in sequence or in parallel.

Different examples of segmented codes and related apparatus, methods, and systems are presented herein. Embodiments may involve different operations during an encoding/decoding sequence, but enable parallel or otherwise lower complexity and/or lower latency decoding at a receiver.

Figure 8:
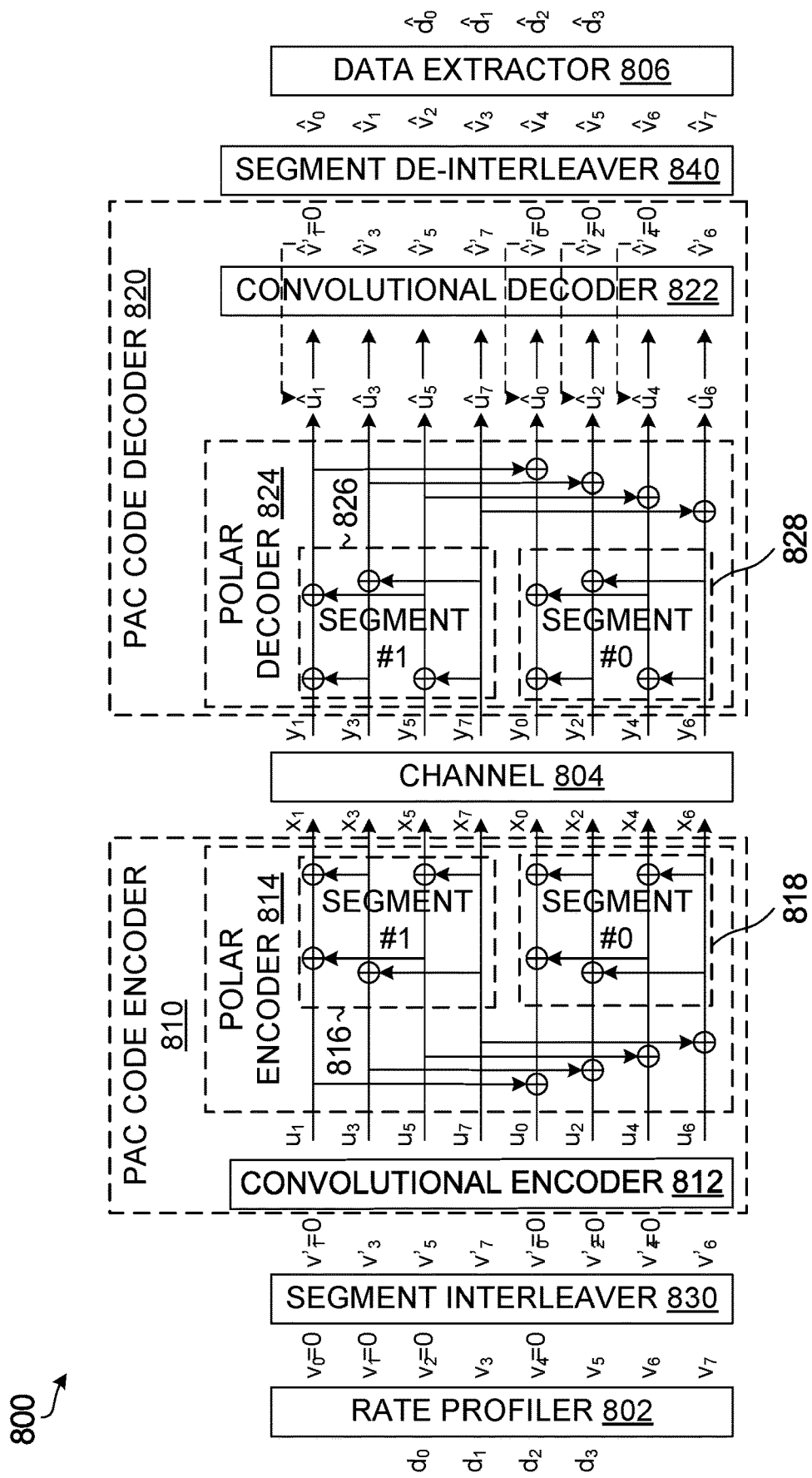
FIG. 8 is a block diagram illustrating an example PAC coding system with code segmentation based on outer code segment interleaving.

FIG. 8 is a block diagram illustrating an example PAC coding system 800 with code segmentation based on outer code segment interleaving. In FIG. 8 and some of the subsequent drawings, an N=8, K=4 code with information bits at sub-channel indices #3, #5, #6 and #7 is used as an illustrative and non-limiting example, and data flows from left to right and from top to bottom.

The example PAC coding system 800 includes a rate profiler 802, a PAC code encoder 810, a channel 804, a PAC code decoder 820, and a data extractor 806, coupled together to receive inputs and provide outputs as shown. The PAC code encoder 810 includes a convolutional encoder 812 and a polar encoder 814 coupled to the convolutional encoder, and the PAC code decoder 820 includes a polar decoder 824 and a convolutional decoder 822 coupled to the polar decoder. The polar encoder 814 includes two segment encoders 816, 818, and the polar decoder 824 includes two segment decoders 826, 828. In addition to these elements of a PAC code encoding and decoding chain, the example PAC coding system 800 in FIG. 8 also includes interleaver modules or stages, shown as a segment interleaver 830 and a segment de-interleaver 840.

The elements shown in FIG. 8 may be implemented in any of various ways. For example, these elements may be implemented using hardware or circuitry, examples of which are provided elsewhere herein, including hardware or circuitry configured to execute software. In an embodiment, the rate profiler 802 and the data extractor 806 are implemented in hardware or circuitry to map data to and extract data from sub-channels. The segment interleaver 830 and the segment de-interleaver 840 include or otherwise implement cross-connections between inputs and outputs in order to produce interleaved and de-interleaved sequences as shown. The convolutional encoder 812 and the convolutional decoder 822 may be implemented using shift registers and one or more adders, and examples are provided elsewhere herein. Example structures for the polar encoder 1214 and the polar decoder 1224 are shown in FIG. 8 as modulo-2 adders. Examples of the channel 804 over which codewords may be transmitted and received are provided elsewhere herein.

These are illustrative example implementations of the elements shown in FIG. 8. Other embodiments are also possible.

At the input side of the PAC code encoder 810, the outer code segment interleaver 830 is coupled to the rate profiler 802, to interleave the sub-channels from the rate profiler 802. In the example shown, the segment interleaver 830 is configured to interleave the sub-channels such that all odd index sub-channels are relocated, permuted, or reordered as the first inputs into the convolution encoder 812, followed by all even index sub-channels. As shown, input order into the convolutional encoder 812 is 1, 3, 5, 7, 0, 2, 4, 6. The polar transform is then applied by the polar encoder 814 in two steps or stages, to allow the separate encoding of segment #0 (even sub-channels) and segment #1 (odd sub-channels) by the segment encoders 816, 818.

At the decoder, segment #1 is processed first and the values of $\hat{v}'_x$ (where x=1, 3, 5, 7) are estimated. Then segment #0 is decoded, taking into consideration the $\hat{u}_x$ values to generate the values of $\hat{u}_y$ (where y=0, 2, 4, 6) before the convolutional decoding stage implemented by the convolutional decoder 822. Once all bits of vector $\hat{v}'$ are ready, the sub-channels are re-ordered by the outer code segment de-interleaver 840, before data extraction by the data extractor 806.

A PAC code segmentation approach based on segment interleaving as shown by way of example in FIG. 8 may be advantageous in that it enables a single decoder module to be used at the decoder side, and sized for codewords of length N/2 instead of length N, to sequentially process the segments. Therefore, although the segment decoders 826, 828 are shown separately in FIG. 8, a single segment decoder could be shared between segments. An alternative implementation could have a dedicated decoder or decoder instance per segment, for parallel decoding. However, because of the convolutional outer code convolution, decoded segment #1 is used in processing segment #0. To maximize or at least increase hardware utilization in embodiments with a decoder or decoder instance for each segment, one segment decoder such as the segment #1 decoder 826 in FIG. 8 can be active and processing a segment from a next codeword while the other decoder(s) such as the segment #0 decoder 828 in FIG. 8 completes the decoding of a current codeword.

Also, depending on the particular type of decoding that is implemented, a smaller codeword length can result in short decoding latency. For example, an SC-Fano decoder tracking a decoding path metric may have its search space reduced considerably when finding the decoding path of a 64-bit codeword compared to a 128-bit codeword.

Figure 9:
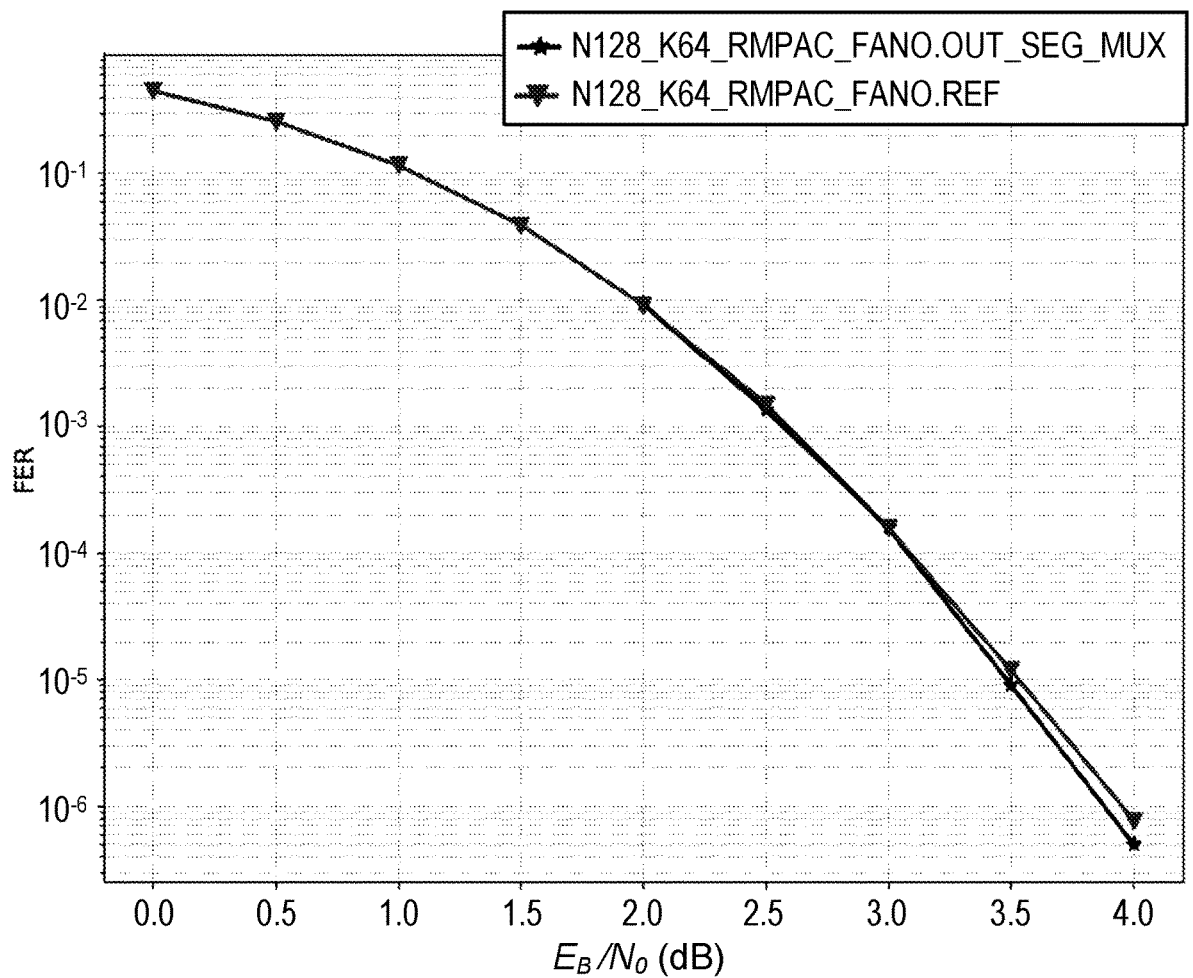
FIG. 9 is a plot of performance results from simulations.

FIG. 9 is a plot of performance results from simulations, and includes a reference trace for non-segmented PAC coding and a trace for PAC coding with segmentation using outer code segment interleaving, for an N=128, K=64 PAC code and Fano-based decoding. Similar or different results might be observed under different simulation conditions, and/or under similar or different operating conditions.

The simulation results show that PAC code segmentation does not degrade code performance. The two traces nearly entirely overlap over most of the range shown in FIG. 9, with a Frame Error Rate (FER) gain at 4 dB for segmented PAC coding relative to non-segmented PAC coding (4.9E-7 versus 7.7E-7). Substantially the same error performance for segmented and non-segmented PAC coding is expected in this example, because the polar transform that is applied in PAC coding with a power-of-2 mother code length for the polar coding stage is based on expansion of a 2-by-2 kernel. For example, the polar transform applied by the polar encoder 814 in FIG. 8 strictly follows the 8-by-8 expansion of the polar 2-by-2 kernel, and therefore it is expected that error performance of the polar code in FIG. 8, and at least some other embodiments herein, will remain substantially the same as for a non-segmented polar code.

Figure 10:
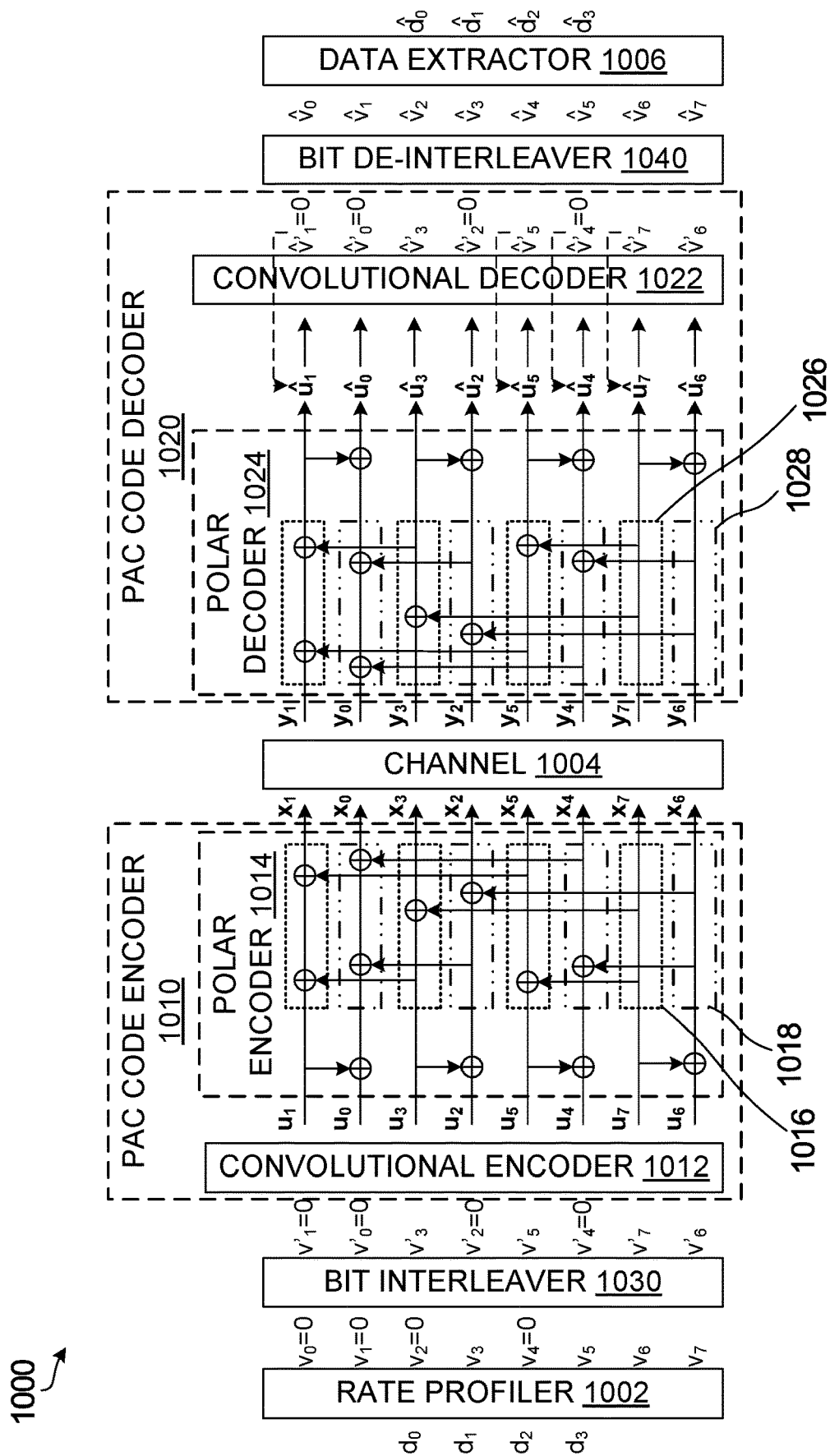
FIG. 10 is a block diagram illustrating an example PAC coding system with code segmentation based on outer code bit interleaving.

FIG. 10 is a block diagram illustrating an example PAC coding system 1000 with code segmentation based on outer code bit interleaving. In FIG. 10, as in FIG. 8, an N=8, K=4 code with information bits at sub-channel indices #3, #5, #6 and #7 is used as an illustrative and non-limiting example, and data flows from left to right and from top to bottom.

The example PAC coding system 1000 includes a rate profiler 1002, a PAC code encoder 1010, a channel 1004, a PAC code decoder 1020, and a data extractor 1006, coupled together to receive inputs and provide outputs as shown. The PAC code encoder 1010 includes a convolutional encoder 1012 and a polar encoder 1014 coupled to the convolutional encoder, and the PAC code decoder 1020 includes a polar decoder 1024 and a convolutional decoder 1022 coupled to the polar decoder. The polar encoder 1014 includes two segment encoders 1016, 1018, and the polar decoder 1024 includes two segment decoders 1026, 1028.

The segments in FIG. 10 are not grouped together as in FIG. 8, and therefore the segment encoders 1016, 1018 and the segment decoders 1026, 1028 are each illustrated with multiple blocks. With reference to the segment encoder 1016, only one block is labeled in order to avoid further congestion in the drawing. The dotted line blocks in the polar encoder 1014 are part of a segment #1 encoder 1016. Similarly, the blocks that are shown in a " — ·· — " pattern in the polar encoder 1014 are part of a segment #0 encoder 1018. In the polar decoder 1024, the dotted line blocks are part of a segment #1 decoder 1026 and the blocks that are shown in a " — ·· — " pattern are part of a segment #0 decoder 1028.

These elements in FIG. 10 implement a PAC code encoding and decoding chain. FIG. 10 also includes interleaver modules or stages, shown as a bit interleaver 1030 and a bit de-interleaver 1040.

The example implementations provided above for the elements of FIG. 8 also apply to FIG. 10, and as noted above for FIG. 8, other embodiments of FIG. 10 are also possible.

Instead of segment interleaving as shown in FIG. 8, PAC code segmentation in the example coding system 1000 in FIG. 10 is based on outer code bit interleaving. The outer code bit interleaver 1030 is coupled to the rate profiler 1002, to bit interleave sub-channels. In the example shown, the segment interleaver 1030 is configured to bit interleave the sub-channels such that odd and even index sequence is reversed on a pair-wise basis. At the input of the convolutional encoder 1012, the bit sequence is 1, 0, 3, 2, 5, 4, 7, 6. The polar transform applied by the polar encoder 1014, still compliant to the 2-by-2 polar kernel to preserve or at least substantially preserve the code error performance, is reorganized to enable segmentation. The segmented polar transform is illustrated with separated blocks as noted above, to show the bit sequence for encoding, and similarly for decoding at the polar decoder 1024. These blocks, even if separated in the block diagram of FIG. 10, allow separate segment #0 and #1 encoding and decoding of even and odd sub-channels, respectively.

At the polar decoder 1024, separate sequential or parallel decoding can still be performed, with a dependency from segment #1 into segment #0 for each decoded bit. Although the implementation of segmentation is different between FIG. 10 and FIG. 8, segment decoding in FIG. 10 may be similar to that in FIG. 8, with segment #1 decoding being performed before segment #0 decoding, sub-channels being re-ordered by the outer code bit de-interleaver 1040 when the bits of vector $\hat{v}'$ are ready, and then data being extracted by the data extractor 1006.

Bit-based segmentation as shown by way of example in FIG. 10 may offer benefits similar to those described herein for outer code segment interleaving in terms of decoder latency, decoder complexity, or both.

Figure 11:
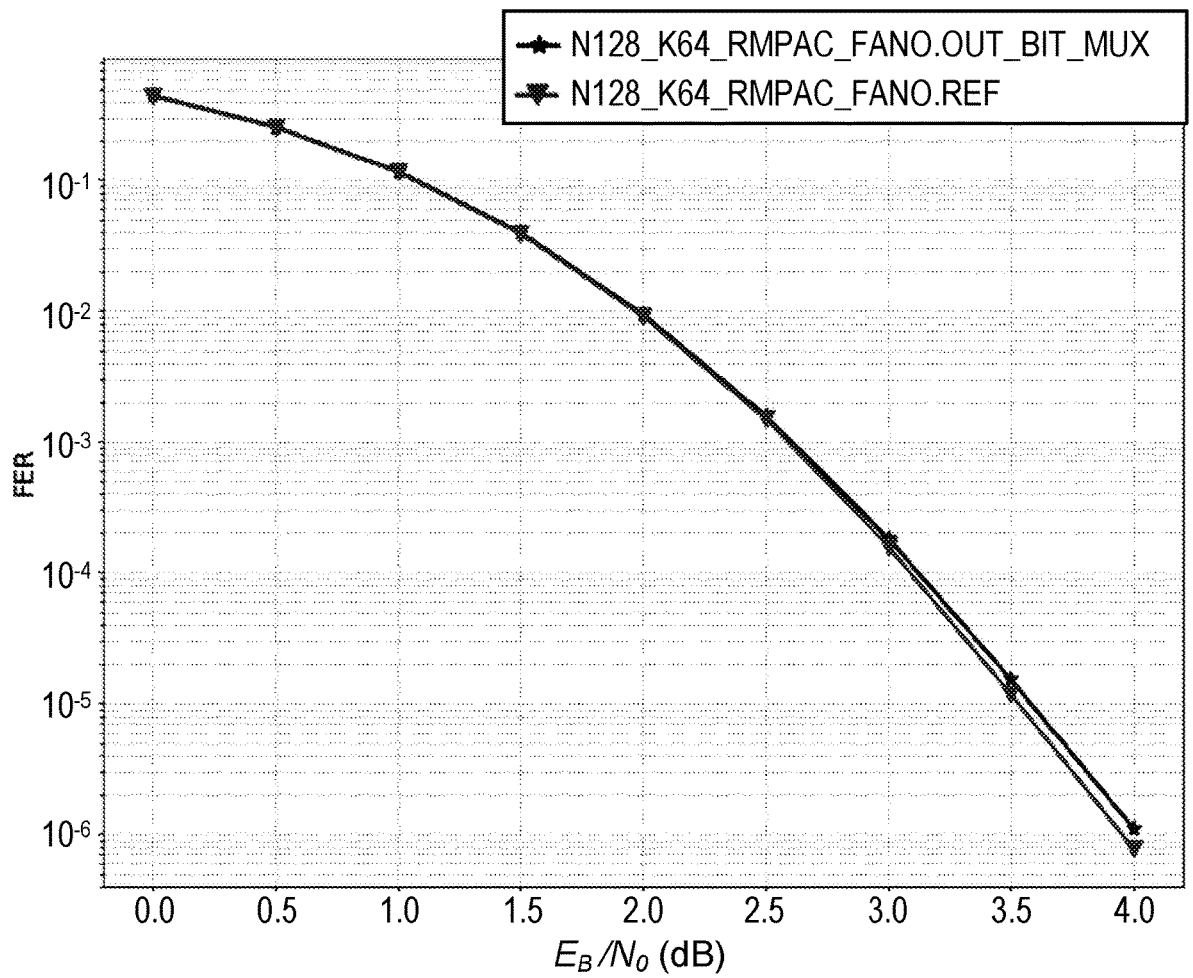
FIG. 11 is a plot of further performance results from simulations.

FIG. 11 is a plot of further performance results from simulations, and includes a reference trace for non-segmented PAC coding and a trace for PAC coding with segmentation using outer code bit interleaving, for an N=128, K=64 PAC code and Fano-based decoding. Similar or different results might be observed under different simulation conditions, and/or under similar or different operating conditions.

These simulation results show that bit-based PAC code segmentation does not degrade code performance. The two traces nearly entirely overlap over most of the range shown in FIG. 11, with an FER gain observed for segmented PAC coding relative to non-segmented PAC coding above about 3 dB.

Figure 12:
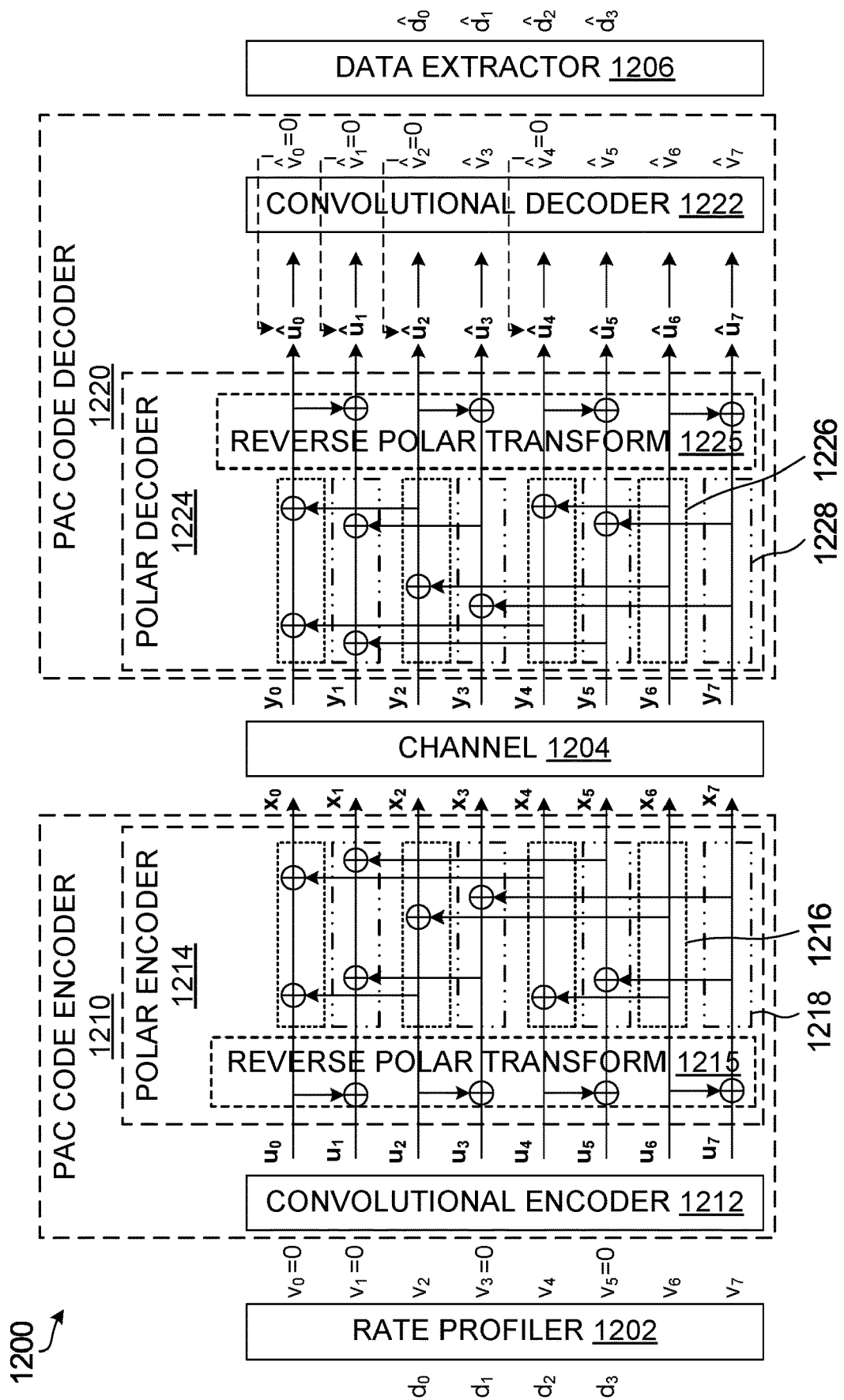
FIG. 12 is a block diagram illustrating an example PAC coding system with code segmentation based on a reverse polar transform.

Interleaving may be applied as a segmentation transform in some embodiments, but interleaving is not mandatory for PAC code segmentation. FIG. 12, for example, is a block diagram illustrating an example PAC coding system with code segmentation based on a reverse polar transform.

Similar to the embodiments in FIGS. 8 and 10, the example PAC coding system 1200 in FIG. 12 is based on an N=8, K=4 code with information bits at sub-channel indices #3, #5, #6 and #7 as an illustrative and non-limiting example, and includes a rate profiler 1202, a PAC code encoder 1210, a channel 1204, a PAC code decoder 1220, and a data extractor 1206, coupled together to receive inputs and provide outputs as shown. The PAC code encoder 1210 includes a convolutional encoder 1212 and a polar encoder 1214 coupled to the convolutional encoder, and the PAC code decoder 1220 includes a polar decoder 1224 and a convolutional decoder 1222 coupled to the polar decoder. The polar encoder 1214 includes two segment encoders 1216, 1218, and the polar decoder 1224 includes two segment decoders 1226, 1228. As in FIG. 10, the segments in FIG. 12 are not grouped together, and therefore the segment encoders 1216, 1218 and the segment decoders 1226, 1228 are illustrated with multiple blocks and different line patterns. At the polar encoder 1214, 1216 denotes a segment #1 encoder and 1218 denotes a segment #0 encoder, and at the polar decoder 1224, 1226 denotes a segment #1 decoder and 1228 denotes a segment #0 decoder.

These elements in FIG. 12 implement a PAC code encoding and decoding chain, and the example implementations provided above for such PAC code encoding and decoding chain elements with reference to FIG. 8 also apply to FIG. 12. In addition to these elements, the example PAC coding system 1200 in FIG. 12 also includes reverse polar transform elements 1215, 1225. The reverse polar transform elements

1215, 1225 implement modulo 2 addition, and may be implemented using modulo 2 adders or XOR gates, for example. Other options for implementing modulo 2 addition may also or instead be applied to the reverse polar transform elements 1215, 1225.

At the encoding side of the example PAC coding system 1200, the sub-channel sequence is maintained as 0, 1, 2, 3, 4, 5, 6, 7 for input to the convolutional encoder 1212. The reverse polar transform applied at the reverse polar transform element 1215 in effect flips or reverses the modulo-2 addition before the segment encoders 1216, 1218 such that the $u_x$ value contributes to the $u_{x+1}$ value for x=0, 2, 4, 6, instead of strictly following the 2-by-2 polar kernel in which $u_{x+1}$ is added to $u_x$. At the polar decoder 1224, the value of $\hat{u}_x$ for x=0, 2, 4, 6 does not depend on the $\hat{u}_{x+1}$ value, but rather the $\hat{u}_{x+1}$ value depends on the $u_x$ value, and as in other embodiments segment #1 decoding can be performed before segment #0 decoding. When the bits of vector $\hat{v}'$ are ready after convolutional decoding by the convolutional decoder 1222, data can be extracted by the data extractor 1206.

FIGS. 8, 10, and 12 represent three embodiments of PAC code segmentation. Segment interleaving as shown by way of example in FIG. 8 may be preferred for its separation of segments and grouping of segments together, which may improve efficiency of design relative to bit-based segmentation by bit interleaving or a reverse polar transform as shown by way of example in FIGS. 10 and 12, respectively. Bit-based segmentation may be advantageous over segment interleaving, however, in respect of enabling the segment decoders 1026, 1028 or 1226, 1228 to be synchronized per-bit instead of only after decoding of an entire segment. For error performance, segment interleaving or bit interleaving may be preferred over a reverse polar transform, because the polar transform that is applied in interleaving embodiments can be based on expansion of a 2-by-2 kernel, and therefore segmenting can be implemented without substantially affecting overall code performance. Reversing a stage during polar encoding and decoding as shown by way of example in FIG. 12, however, modifies the reliabilities of the sub-channels, and segmented PAC code performance may vary according to the selection method for A.

The embodiments in FIGS. 8, 10, and 12 illustrate examples of segmentation transforms. Some embodiments may involve other features of a PAC coding system. Consider convolutional coding as an example.

Figure 13:
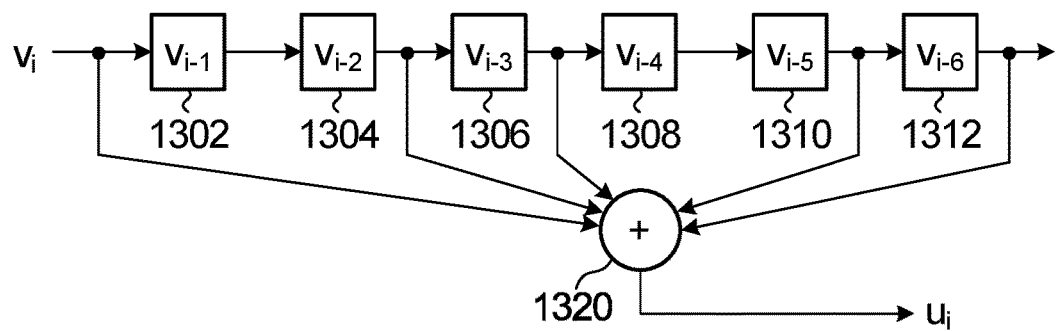
FIG. 13 is a block diagram illustrating a convolution structure in Arikan PAC encoding.

FIG. 13 is a block diagram illustrating a convolution structure 1300 in Arikan PAC encoding. The convolution structure 1300 includes shift registers 1302, 1304, 1306, 1308, 1310, 1312 and a modulo-2 adder 1320, which operate to transform a rate profiler output v into a polar encoder input u. The convolution in FIG. 13 has a depth of 7 and a polynomial of $133_8$, and in Arikan PAC coding the shift registers 1302, 1304, 1306, 1308, 1310, 1312 are initialized to 0 prior to encoding or decoding. The convolution output from the adder 1320 in FIG. 13 depends only on the current bit and the previous 6 input bits.

Figure 14:
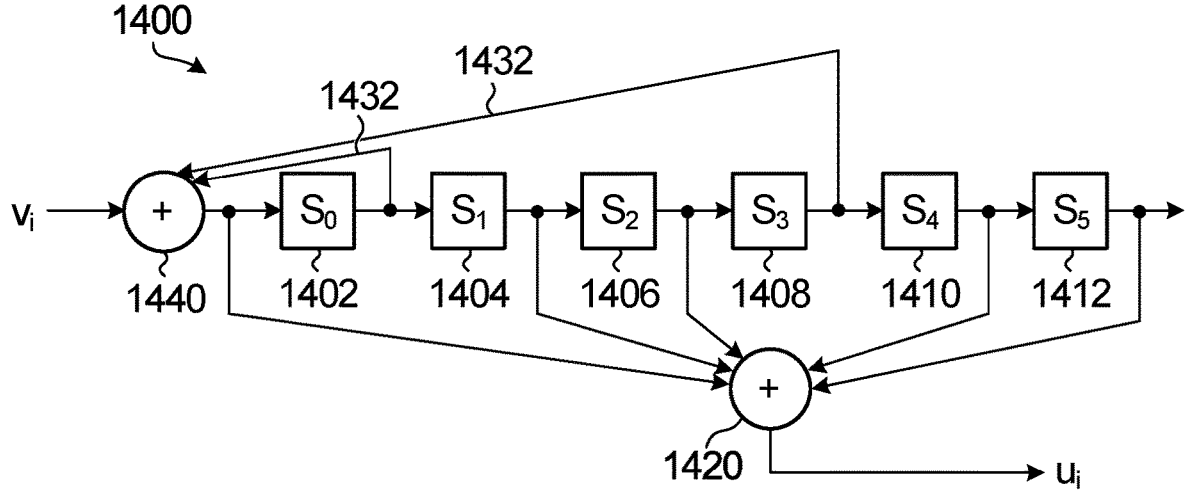
FIG. 14 is a block diagram illustrating a convolution structure 1400 in accordance with an embodiment.

FIG. 14 is a block diagram illustrating a convolution structure 1400 in accordance with an embodiment. The convolution structure 1400, like the convolution structure 1300, includes shift registers 1402, 1404, 1406, 1408, 1410, 1412 and a modulo-2 adder 1420, but also includes feedback paths 1432, 1434 and an input adder 1440. The convolution structure 1400 operates to transform a rate profiler output v into a polar encoder input u, but by applying feedback as shown by way of example in FIG. 14, each output bit from the adder 1420 is determined in part by additional preceding input bits of the convolution. In the example shown, feedback is applied to the input v from the shift registers 1402, 1408 via the feedback paths 1432, 1434 and the adder 1440, and the output from the adder 1420 is therefore determined based on all of the preceding input bits. The feedback applied to a convolution input can be described via a feedback polynomial, such as $44_8$ in the example shown in FIG. 14. Such feedback can also be described as feeding back outputs from shift registers from which outputs are not already used as inputs to the adder 1420 to determine the convolution output. Feeding back shift register outputs that are already used as inputs to the adder 1420 would in effect cancel the effect of such shift register outputs on the convolution output from the adder 1420. A feedback polynomial or selection of shift registers or positions for feedback may therefore be closely related to a convolution polynomial or the shift registers or positions that are used in a convolution.

Convolution state is initialized to 0 prior to encoding or decoding in Arikan PAC coding, as noted above. The first bits of v are almost always frozen bits, and hence the output of the convolution for these bits with initialization to 0 is almost always 0. A non-zero convolution output for these bits can be achieved by initializing one or more of the shift registers 1402, 1404, 1406, 1408, 1410, 1412 to values other than 0. When non-zero initialization is combined with a feedback strategy shown by way of example in FIG. 14, the output stream of a convolution is unique for a particular initial condition, given the same input stream.

It may be preferable to implement non-zero convolution state initialization in combination with convolution feedback, to avoid an initial state being flushed out of shift registers more quickly. Convolution feedback may be implemented with or without non-zero convolution state initialization.

Figure 15:
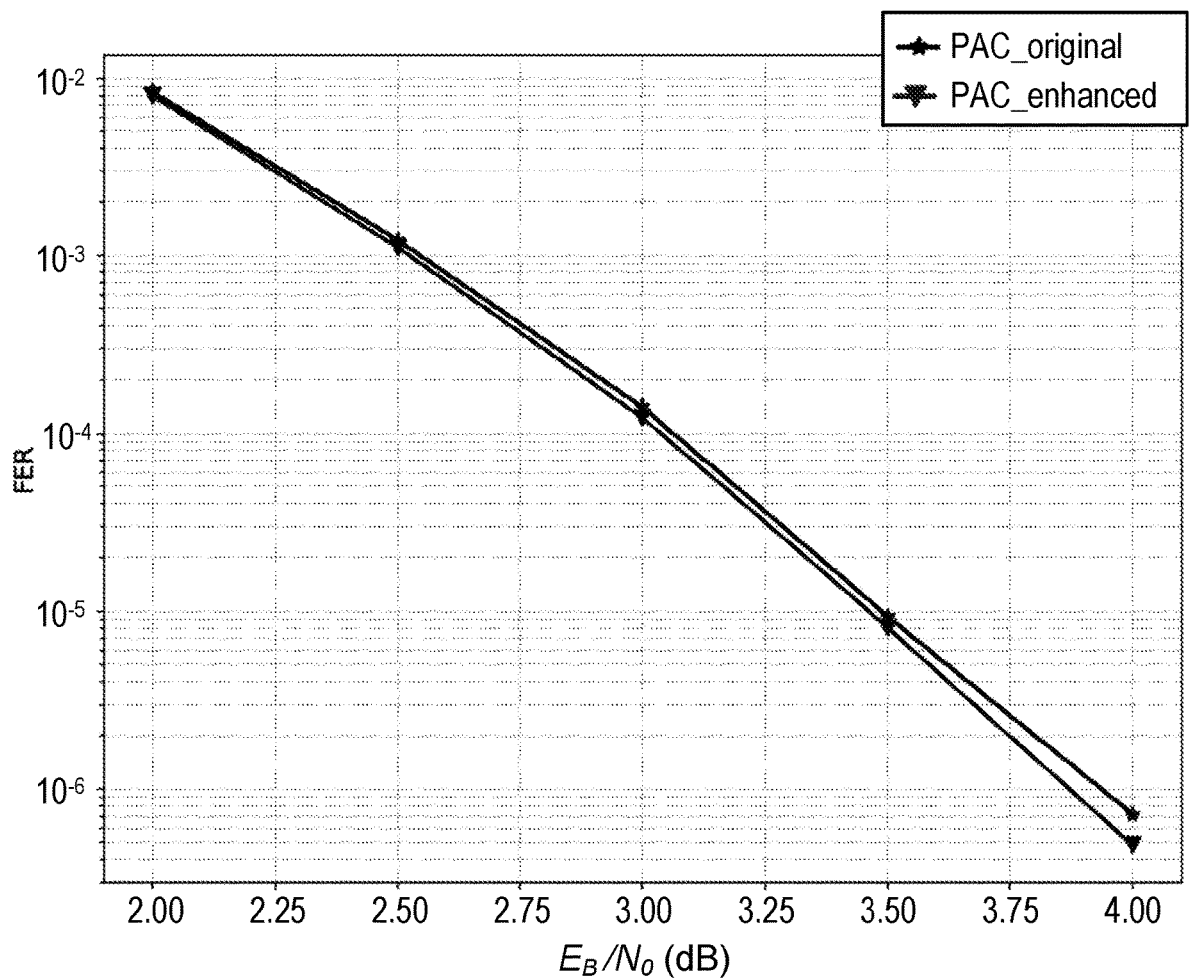
FIG. 15 is a plot of additional performance results from simulations.

A convolution feedback and non-zero convolution state initialization strategy as shown by way of example in FIG. 14 may be useful in enhancing FER performance of PAC coding. FIG. 15 is a plot of additional performance results from simulations, and includes a reference trace for Arikan PAC coding with convolution of the type shown in FIG. 13 and a trace for PAC coding with convolution of the type shown in FIG. 14, for an N=128, K=64 PAC code with polar code using Reed-Muller construction. For simulation, the Arikan PAC convolution had a depth of 7 and polynomial of $133_8$, and the convolution with feedback and non-zero convolution state initialization used the same convolution depth and convolution polynomial with a feedback polynomial of $44_8$ and initial values of $s_{0-5}=77_8$. Similar or different results might be observed under different simulation conditions, and/or under similar or different operating conditions.

FIG. 15 shows that the simulated PAC coding with convolution feedback and non-zero convolution state initialization has superior FER performance compared to the simulated reference Arikan PAC coding.

The outer convolutional code in PAC coding may improve code performance by using the frozen sub-channels with a fixed value of 0 or 1. At a decoder, frozen bits are estimated and matched against the expected fixed value. A match between a frozen bit estimate and the expected fixed value validates a current decoding path, while a mismatch indicates a possible erroneous estimate for the previous bit or the current bit. In the case of a mismatch, the decoding path is penalized, and the decoder may be forced to explore alternative paths.

Because of the polarization of the sub-channels in a polar code, the last codeword bits are more reliable than the first codeword bits. However, in Arikan PAC coding as illustrated by way of example in FIG. 7, a codeword may end with a long sequence of information bits, without frozen bits, and a PAC code decoder cannot leverage frozen bit estimates to validate decoding of the last information bits.

One possible approach to potentially improve code performance is to insert one or multiple frozen bits at or toward the end of a codeword. The decoder can then benefit from the inserted frozen bit(s) to check the correctness of its decoding path(s).

However, it is understood that a match between frozen bit estimates and outer convolutional code expected values does not guarantee successful decoding. Adding a check code at the encoding stage would enable the decoder to confirm the correctness of the decoding path. A check code can be calculated, for example, using a CRC, a parity check, a Hamming code, or any other mechanisms that can generate redundant data bits to be inserted into a codeword to enable a decoder to reproduce the same calculations over the same information bits.

A PAC code with an embedded check code may improve code performance, because the decoder can confirm the correctness of the decoding path. For example, the decoder may determine whether a checksum computed from estimated values of decoded bits matches a checksum that is also estimated from a received codeword. In the case of a mismatch, the decoder can explore alternative decoding paths until a successful check is observed.

As noted above, the first bits of a polar codeword are less reliable compared to the last bits. A decoder may therefore maintain or explore multiple paths early in the decoding process, until more reliable bits are estimated. If one or more intermediate checksums are inserted at different codeword indices, then a PAC code construction enables the decoder to check decoding paths earlier in the decoding process. In the case of a checksum failure, the decoder can immediately determine that a current decoding path is invalid. For example, in the case of an SCL decoder, a path for which a checksum failure is detected is dropped from the list. The list size of the decoder can then be reduced without sacrificing decoding performance. For the example of an SC-Fano decoder, a path with an intermediate checksum mismatch would not be explored, allowing the decoder to converge faster toward a better decoding path.

Figure 16:
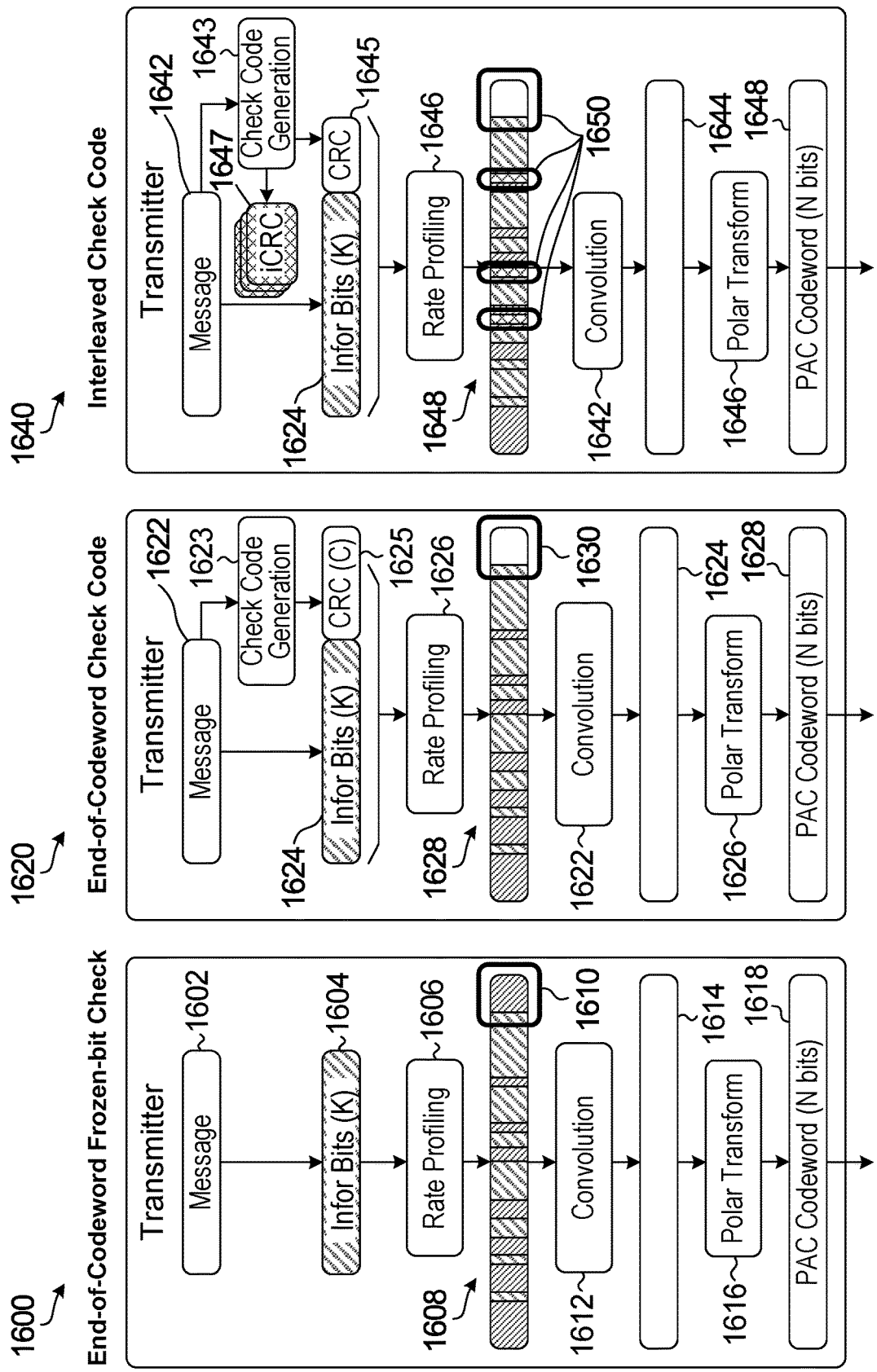
FIG. 16 is a block diagram illustrating examples of PAC coding to support different types of code checking.

FIG. 16 is a block diagram illustrating examples of PAC coding to support different types of code checking. The examples show three forms of embedded check codes at 1600, 1620, 1640. Each example relates to encoding a message 1602, 1622, 1642 using K information bits 1604, 1624, 1644 at a time, and involves rate profiling at 1606, 1626, 1646, convolutional encoding of sub-channels 1608, 1628, 1648 at 1612, 1622, 1642, and polar encoding of convolutionally encoded bits 1614, 1624, 1644 using a polar transform at 1616, 1626, 1646 to generate N-bit PAC codewords at 1618, 1628, 1648.

In the example 1600, frozen sub-channels 1610 are inserted at the end of the sub-channels 1608 to provide a self-check capability for what would otherwise be a long sequence of information bits only. An end-of-codeword check code example is shown at 1620, and involves check code generation at 1623, to generate a CRC 1625 that is inserted at the end of the sub-channels 1628 at 1630 in the example shown. The example 1640 similarly involves check code generation and insertion at 1643, 1645, but intermediate check codes 1647 are additionally generated and inserted at different codeword indices 1650.

At a receiver, the embedded check code(s) are used to recover the messages 1602, 1622, 1642, K information bits at a time from received codewords.

FIG. 16 illustrates different PAC code construction approaches with check code generation in the examples 1620, 1640 based on the original messages 1622, 1642. In other embodiments, one or more check codes may be generated or added at different encoding stages. For example, a check code can be calculated after rate profiling at 1626, or after convolutional encoding at 1622. These variations are also applicable to generation and insertion of intermediate check codes.

It should also be appreciated that embedded check code approaches are not necessarily mutually exclusive. Frozen bit insertion can be used in combination with check code generation, for example.

In all of these example, and others consistent with embedded check codes as proposed herein, a decoder can use a check code to potentially improve decoding performance, reduce decoding latency, and/or minimize hardware complexity.

Figure 17:
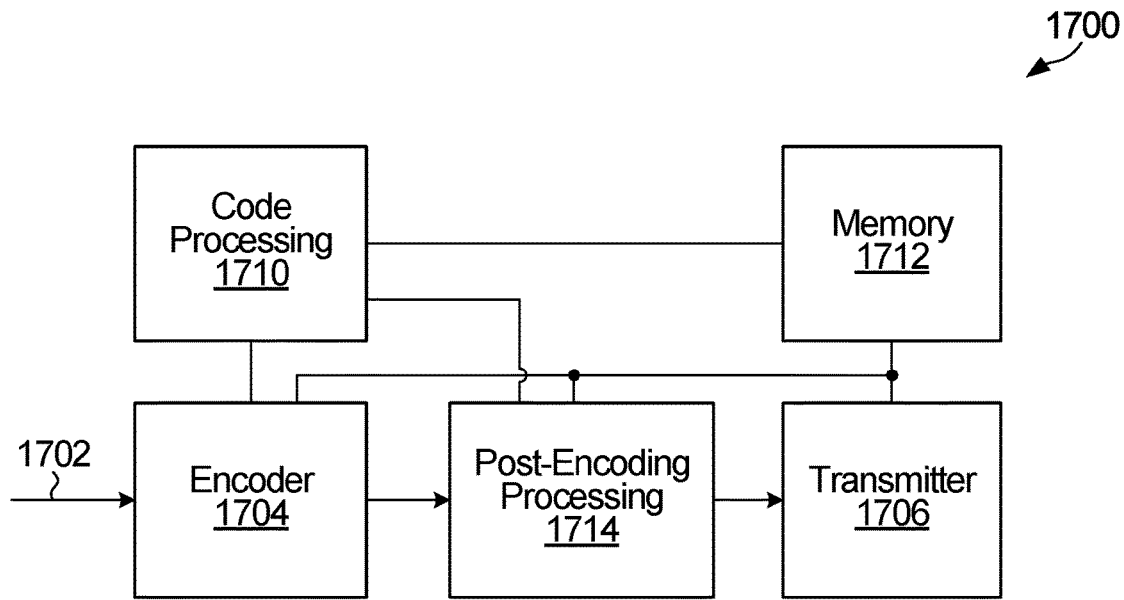
FIG. 17 is a block diagram of an example apparatus for encoding and transmitting codewords.

FIG. 17 is a block diagram of an example apparatus for encoding and transmitting codewords. The apparatus 1700 includes an encoder module 1704 coupled to a transmitter module 1706. The apparatus 1700 also includes a code processing module 1710 coupled to the encoder module 1704 and a post-encoding processing module 1714. The post-encoding processing module 1714 is also coupled to the encoder module 1704 and to the transmitter module 1706. A memory 1712, also shown in FIG. 17, is coupled to the encoder module 1704, to the code processing module 1710, to the post-encoding processing module 1714, and to the transmitter module 1706. Although not shown, the transmitter module 1706 could include a modulator, an amplifier, antenna and/or other modules or components of a transmit chain or alternatively could be configured to interface with a separate (Radio-Frequency, RF) transmission module. For example, some or all of the modules 1704, 1706, 1710, 1712, 1714 of the apparatus 1700 may be implemented in hardware or circuitry (e.g. in one or more chipsets, microprocessors, Application-Specific Integrated Circuits (ASICs), Field-Programmable Gate Arrays (FPGAs), dedicated logic circuitry, or combinations thereof) so as to produce codewords as described herein for transmission by a separate (RF) unit.

In some embodiments, the memory 1712 is a non-transitory computer readable medium, that includes instructions for execution by a processor to implement and/or control operation of the code processing module 1710, the encoder module 1704, the post-encoding processing module 1714, and the transmitter module 1706 in FIG. 17, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 1712.

In some embodiments, the encoder module 1704 is implemented in circuitry, such as a processor, that is configured to encode input bits as disclosed herein. FIG. 17 is one example of an encoder module. In a processor-based implementation of the encoder module 1704, processor-executable instructions to configure a processor to perform encoding operations are stored in a non-transitory processor-readable medium. The non-transitory medium could include, in the memory 1712 for example, one or more solid-state memory devices and/or memory devices with movable and possibly removable storage media.

The code processing module 1710 could be implemented in circuitry that is configured to determine coding parameters such as mother code block length, and to determine an ordered sub-channel sequence as disclosed herein and also referred to herein as rate profiling. In some embodiments, the code processing module 1710 is implemented using a processor. The same processor or other circuitry, or separate processors or circuitry, could be used to implement both the encoder module 1704 and the code processing module 1710. As noted above for the encoder module 1704, in a processor-based implementation of the code processing module 1710, processor-executable instructions to configure a processor to perform code processing operations are stored in a non-transitory processor-readable medium, in the memory 1712 for example.

Like the encoder module 1704 and the code processing module 1710, the post-encoding processing module 1714 is implemented in circuitry, such as a processor, that is configured to perform various post-encoding operations. These post-encoding operations could include rate-matching operations such as puncturing, shortening and/or interleaving, for example. In a processor-based implementation of the post-encoding processing module 1714, processor-executable instructions to configure a processor to perform post-encoding operations are stored in a non-transitory processor-readable medium, examples of which are described elsewhere herein. In an embodiment, the post-encoding processing module 1714 derives a puncturing or shortening scheme from a puncturing or shortening scheme that is to be applied to a codeword prior to transmission. Information indicative of bit positions and/or sub-channels that are affected by post-encoding operations, or information from which such bit positions or sub-channels may be determined, may be fed back to the code processing module 1710, stored to the memory 1712, or otherwise made available to the code processing module 1710 by the post-encoding processing module 1714.

In some embodiments of the code processing module 1710, the coding parameters and/or the ordered sub-channel sequence may be determined based on information from the post-encoding processing module 1714. For instance, the ordered sub-channel sequence may be determined based on the rate-matching scheme determined by the post-encoding processing module 1714. Conversely, in some other embodiments, the post-encoding processing module 1714 may determine a rate-matching scheme based on the coding parameters and/or the ordered sub-channel sequence determined by the code processing module 1710. In yet some other embodiments, the determinations made within the code processing module 1710 and post-encoding processing module 1714 are jointly performed and optimized.

In an embodiment, the encoder module 1704 is configured to receive input bits at 1702, and encode those input bits into a codeword. The transmitter module 1706 is coupled to the encoder module 1704, through the post-encoding processing module 1714 in the example shown, to transmit the codeword.

The encoder module 1704 is an example of an encoder to generate a codeword based on a segmentation transform and a PAC code that involves an outer convolutional code and a polar code, and based on separate encoding of respective different segments of convolutionally encoded input bits according to the polar code. Such an encoder may include, for example, a segment interleaver 830 and a PAC code encoder 810 as shown in FIG. 8, a bit interleaver 1030 and a PAC code encoder 1010 as shown in FIG. 10, or a PAC code encoder 1210 with a polar encoder 1214 that has a reverse polar transform stage 1215 as shown in FIG. 12. Segment interleaving, bit interleaving, and a reverse polar transform are all examples of a segmentation transform that may be applied to a PAC code.

A segmentation transform allows an encoder to generate a codeword, according to the polar code, based on separate encoding of respective different segments of convolutionally encoded input bits. Each segment includes multiple convolutionally encoded input bits for which the separate encoding of the segment is independent of the separate encoding of other segments. There may be interdependencies between bits in different segments in other parts of an encoding process, but the separate segment encoding of each segment as shown by way of example in FIGS. 8, 10, and 12 is independent of the separate segment encoding of other segments. For example, although input bits to the polar encoder 814 are combined before encoding by the segment #0 encoder 818, the separate encoding by the segment #1 encoder 816 is independent of the separate encoding by the segment #0 encoder 818, and similarly the separate encoding by the segment #0 encoder 818 is independent of the separate encoding by the segment #1 encoder 816. Encoding by each segment encoder 816, 818 does not depend on the encoding that is performed by the other segment encoder.

The encoder module 1704, other components of the example apparatus 1700, and/or a processor in a processor-based embodiment, could implement any of various other features that are disclosed herein. In a processor-based embodiment, for example, a memory coupled to the processor may store instructions which, when executed by the processor, cause the processor to perform a method that involves: generating a codeword based on a segmentation transform and a PAC code, and based on separate encoding of respective different segments of convolutionally encoded input bits as disclosed herein.

Other features may also be provided. For example, any one or more of the following could be provided, alone or in any of various combinations, in embodiments:

the segmentation transform involves interleaving the input bits before convolutional encoding according to the outer convolutional code, such as by an interleaver 830, 1030 shown by way of example in FIGS. 8 and 10—an encoder consistent with the present disclosure may therefore include an interleaver such as 830, 1030 and a PAC encoder 810, 1010;

the interleaving may involve interleaving of blocks of the input bits associated with the segments, and in an embodiment the encoder may include a segment interleaver 830 for example;

the interleaving may involve bit interleaving, and in an embodiment therefore the encoder may include a bit interleaver 1030 for example;

the segmentation transform may further include combining convolutionally encoded input bits for the separate encoding of a segment, as shown by way of example at the inputs of the segment #0 encoder 818 in FIG. 8 and at the inputs of the segment #0 encoder in FIG. 10;

the segmentation transform need not involve interleaving in all embodiments, and may instead involve combining convolutionally encoded input bits for the separate encoding of a segment—such combining without interleaving is shown by way of example in FIG. 12, as combining according to a reverse polar transform at 1215;

the outer convolutional code involves a non-zero initial state and state feedback, which may be implanted using a convolution structure such as the structure 1400 in FIG. 14 in an embodiment;

an encoder may be further configured to, or instructions in a processor-based embodiment may cause a processor to, generate a check code to enable checking of decoding of the codeword, checking of decoding of the convolutionally encoded input bits, or both checking of decoding of the codeword and checking of decoding of the convolutionally encoded input bits—see FIG. 16 for illustrative examples of check code generation.

The apparatus 1700 could implement any of various other features that are disclosed herein. For example, the encoder module 1704, the transmitter module 1706, the code processing module 1710, the post-encoding processing module 1714, and/or a processor in a processor-based embodiment, could be configured to implement any one or more of the features listed or otherwise described herein.

In some alternative embodiments, the functionality of the encoder module 1704, the transmitter module 1706, the code processing module 1710, and/or the post-encoding processing module 1714 described herein may be fully or partially implemented in hardware or alternatively in software, for example in modules stored in a memory such as 1712 and executed by one or more processors of the apparatus 1700.

An apparatus could therefore include a processor, and a memory such as 1712, coupled to the processor, storing instructions which, when executed by the processor, cause the processor to perform the functionality and/or embodiments described in relation to the encoder module 1704, the transmitter module 1706, the code processing module 1710, and/or the post-encoding module 1714 described herein.

Figure 18:
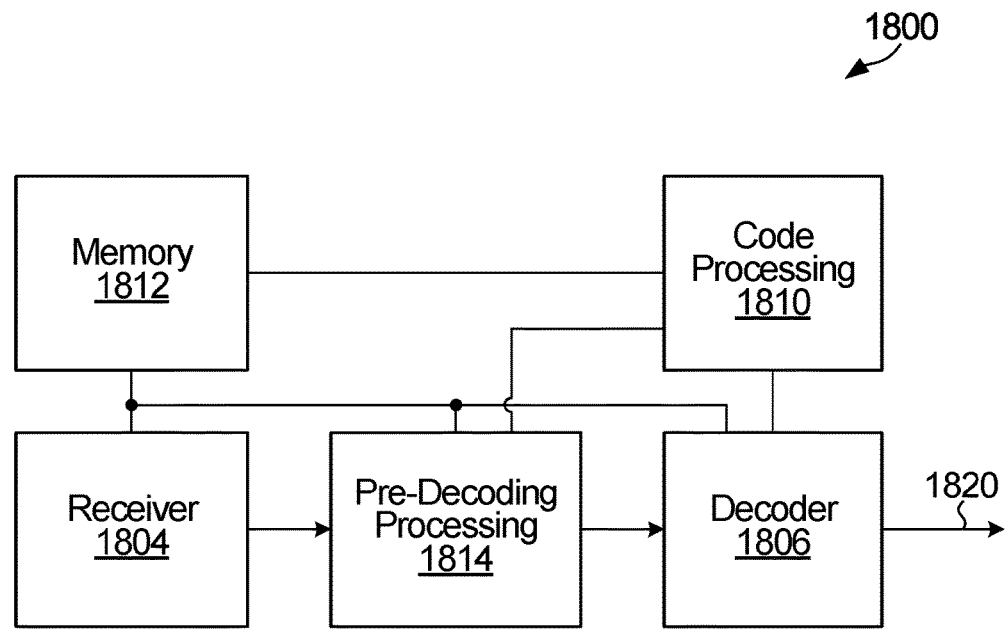
FIG. 18 is a block diagram of an example apparatus for receiving and decoding codewords.

FIG. 18 is a block diagram of an example apparatus for receiving and decoding codewords. The apparatus 1800 includes a receiver module 1804 which is configured to receive signals transmitted wirelessly and which is coupled to a decoder module 1806. The apparatus 1800 also includes a code processing module 1810 coupled to the decoder module 1806 and a pre-decoding processing module 1814. The pre-decoding processing module 1814 is also coupled to the decoder module 1806 and to the receiver module 1804. A memory 1812 also shown in FIG. 18, is coupled to the decoder module 1806, to the code processing module 1810, to the receiver module 1804, and to the pre-decoding processing module 1814.

Although not shown, the receiver module 1804 could include an antenna, demodulator, amplifier, and/or other modules or components of a receive chain or alternatively could be configured to interface with a separate (RF) receiving module. For example, some or all of the modules 1804, 1806, 1810, 1812, 1814 of the apparatus 1800 may be implemented in hardware or circuitry (e.g. in one or more chipsets, microprocessors, ASICs, FPGAs, dedicated logic circuitry, or combinations thereof) so as to receive a word based on a codeword. Decoded bits are output at 1820 for further receiver processing.

In some embodiments, the memory 1812 is a non-transitory computer readable medium that includes instructions for execution by a processor to implement and/or control operation of the receiver module 1804, decoder module 1806, the code processing module 1810, and the pre-decoding processing module 1814 in FIG. 18, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 1812.

The decoder module 1806 is implemented in circuitry, such as a processor, that is configured to decode received codewords as disclosed herein. In a processor-based implementation of the decoder module 1806, processor-executable instructions to configure a processor to perform decoding operations are stored in a non-transitory processor-readable medium. The non-transitory medium could include, in the memory 1812 for example, one or more solid-state memory devices and/or memory devices with movable and possibly removable storage media.

The code processing module 1810 could be implemented in circuitry that is configured to determine (and store to the memory 1812) ordered sub-channel sequences. In a processor-based implementation of the code-processing module 1810, processor-executable instructions to configure a processor to perform code-processing operations are stored in a non-transitory processor-readable medium, examples of which are described herein. Information representing ordered sub-channel sequences, and/or the selected sub-channels could be provided to the decoder module 1806 by the code processing module 1810 for use in decoding received words, and/or stored in the memory 1812 by the code processing module 1810 for subsequent use by the decoder module 1806.

Like the decoder module 1806 and the code processing module 1810, the pre-decoding processing module 1814 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/shortening that was applied at an encoder/transmitter side, for example. In a processor-based implementation of the pre-decoding processing module 1814, processor-executable instructions to configure a processor to perform pre-decoding processing operations are stored in a non-transitory processor-readable medium, examples of which are described above. In an embodiment, the pre-decoding processing module 1814 derives a puncturing or shortening scheme from a puncturing or shortening scheme that is to be applied to a received codeword. Information indicative of bit positions and/or sub-channels that are affected by pre-decoding processing, or information from which such bit positions or sub-channels may be determined, may be fed back to the code processing module 1810, stored to the memory 1812, or otherwise made available to the code processing module 1810 by the pre-decoding processing module 1814.

In some embodiments of the code processing module 1810, the ordered sub-channel sequence may be determined based on information from the pre-decoding processing module 1814. For instance, the ordered sub-channel sequence may be determined based on the rate-matching scheme determined by the pre-decoding processing module 1814. Conversely, in some other embodiments, the pre-decoding processing module 1814 may determine a rate-matching scheme based on the coding parameters and/or the ordered sub-channel sequence determined by the code processing module 1810. In yet some other embodiments, the determinations made within the code processing module 1810 and pre-decoding processing module 1814 are jointly performed and optimized.

In some alternative embodiments, the functionality of the receiver module 1804, the decoder module 1806, the code processing module 1810, and/or the pre-decoding processing module 1814 described herein may be fully or partially implemented in software or modules, for example in receiving and decoding modules stored in a memory 1812 and executed by one or more processors of the apparatus 1800.

An apparatus could therefore include a processor, and a memory such as 1812, coupled to the processor, storing instructions which, when executed by the processor, cause the processor to perform the functionality and/or embodiments disclosed herein, or receiving/decoding operations corresponding to transmitting/encoding operations disclosed herein.

The apparatus 1800 could implement any of various other features that are disclosed herein. For example, the decoder module 1806, the receiver module 1804, the code processing module 1810, and/or the pre-decoding processing module 1814 could be configured to implement any one or more of receiving/decoding features corresponding to encoding/transmitting features disclosed herein.

As an example, an apparatus may include a receiver a receiver to receive a codeword based on a codeword that was generated based on a segmentation transform and a PAC code. The PAC code is based on an outer convolutional code and a polar code, and the codeword was generated by separately encoding respective different segments of convolutionally encoded input bits according to the polar code, as described herein. Each segment includes multiple bits for which the separate encoding of the segment is independent of the separate encoding of other segments. A decoder is coupled to the receiver, to separately decode segments of the received codeword to recover segments of convolutionally encoded input bits corresponding to the separately encoded segments of the convolutionally encoded input bits, and to decode the convolutionally encoded input bits recovered from the received codeword.

A decoder may implement or provide other features, such as decoding features corresponding to encoding features disclosed herein.

Communication equipment could include the apparatus 1700, the apparatus 1800, or both a transmitter and a receiver and both an encoder and a decoder and other components shown in FIGS. 17 and 18. Such communication equipment could be user equipment or communication network equipment.

Figure 19:
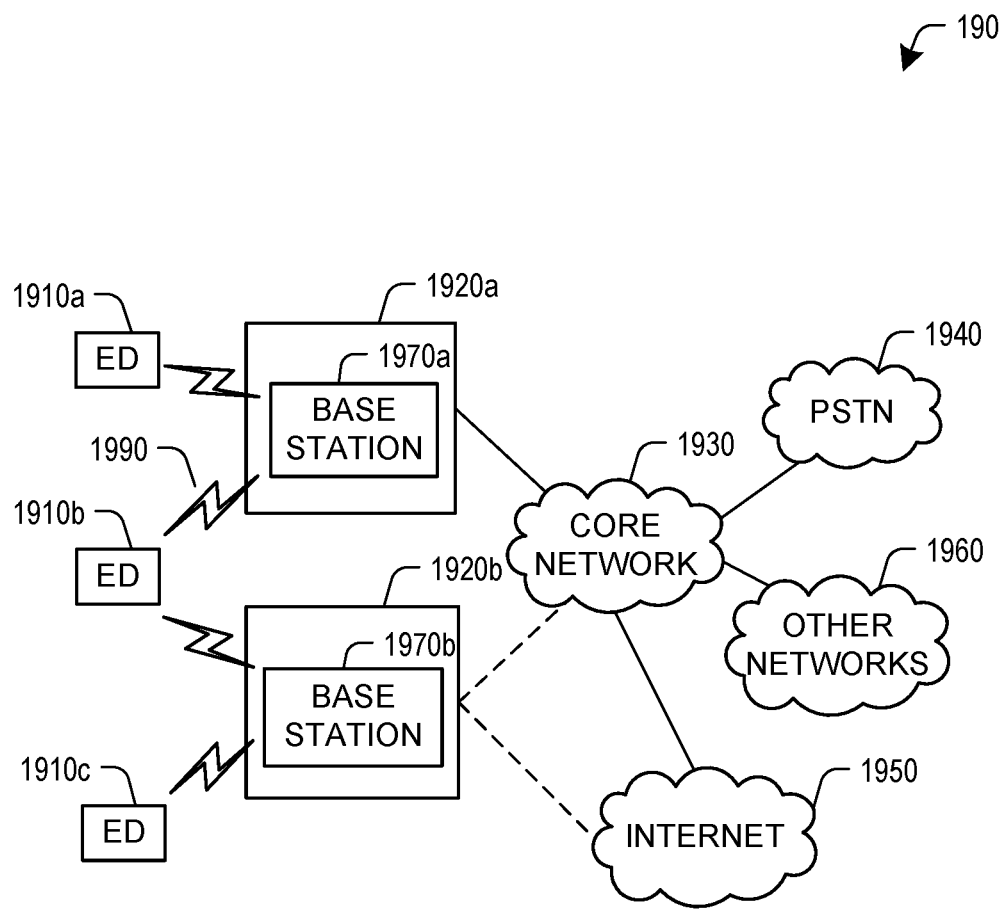
FIG. 19 illustrates an example communication system in which embodiments of the present disclosure could be implemented.

FIG. 19 illustrates an example communication system 1900 in which embodiments of the present disclosure could be implemented. In general, the communication system 1900 enables multiple wireless or wired elements to communicate data and other content. The purpose of the communication system 1900 may be to provide content (voice, data, video, text) via broadcast, narrowcast, user device to user device, etc. The communication system 1900 may operate by sharing resources such as bandwidth.

In this example, the communication system 1900 includes electronic devices (ED) 1910a-1910c, radio access networks (RANs) 1920a-1920b, a core network 1930, a public switched telephone network (PSTN) 1940, the internet 1950, and other networks 1960. Although certain numbers of these components or elements are shown in FIG. 19, any reasonable number of these components or elements may be included.

The EDs 1910a-1910c and base stations 1970a-1970b are examples of communication equipment that can be configured to implement some or all of the functionality and/or embodiments described herein. For example, any one of the EDs 1910a-1910c and base stations 1970a-1970b could be configured to implement the encoding or decoding functionality (or both) described above. In another example, any one of the EDs 1910a-1910c and base stations 1970a-1970b could include an apparatus 1700 (FIG. 17), an apparatus 1800 (FIG. 18), or both.

The EDs 1910a-1910c are configured to operate, communicate, or both, in the communication system 1900. For example, the EDs 1910a-1910c are configured to transmit, receive, or both via wireless or wired communication channels. Each ED 1910a-1910c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 19, the RANs 1920a-1920b include base stations 1970a-1970b, respectively. Each base station 1970a-1970b is configured to wirelessly interface with one or more of the EDs 1910a-1910c to enable access to any other base station 1970a-1970b, the core network 1930, the PSTN 1940, the Internet 1950, and/or the other networks 1960. For example, the base stations 1970a-1970b may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router. Any ED 1910a-1910c may be alternatively or additionally configured to interface, access, or communicate with any other base station 1970a-1970b, the internet 1950, the core network 1930, the PSTN 1940, the other networks 1960, or any combination of the preceding. The communication system 1900 may include RANs, such as RAN 1920b, wherein the corresponding base station 1970b accesses the core network 1930 via the internet 1950, as shown.

The EDs 1910a-1910c and base stations 1970a-1970b are examples of communication equipment that can be configured to implement some or all of the functionality and/or embodiments described herein. In the embodiment shown in FIG. 19, the base station 1970a forms part of the RAN 1920a, which may include other base stations, base station controller(s) (BSC), radio network controller(s) (RNC), relay nodes, elements, and/or devices. Any base station 1970a, 1970b may be a single element, as shown, or multiple elements, distributed in the corresponding RAN, or otherwise. Also, the base station 1970b forms part of the RAN 1920b, which may include other base stations, elements, and/or devices. Each base station 1970a-1970b transmits and/or receives wireless signals within a particular geographic region or area, sometimes referred to as a "cell" or "coverage area". A cell may be further divided into cell sectors, and a base station 1970a-1970b may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 1920a-1920b shown is exemplary only. Any number of RAN may be contemplated when devising the communication system 1900.

The base stations 1970a-1970b communicate with one or more of the EDs 1910a-1910c over one or more air interfaces 1990 using wireless communication links e.g. RF, microwave, infrared (IR), etc. The air interfaces 1990 may utilize any suitable radio access technology. For example, the communication system 1900 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 1990.

A base station 1970a-1970b may implement Universal Mobile Telecommunication System (UMTS) Terrestrial Radio Access (UTRA) to establish an air interface 1990 using wideband CDMA (WCDMA). In doing so, the base station 1970a-1970b may implement protocols such as HSPA, HSPA+ optionally including HSDPA, HSUPA or both. Alternatively, a base station 1970a-1970b may establish an air interface 1990 with Evolved UTMS Terrestrial Radio Access (E-UTRA) using LTE, LTE-A, and/or LTE-B. It is contemplated that the communication system 1900 may use multiple channel access functionality, including such schemes as described above. Other radio technologies for implementing air interfaces include IEEE 802.11, 802.15, 802.16, CDMA2000, CDMA2000 1x, CDMA2000 EV-DO, IS-2000, IS-95, IS-856, GSM, EDGE, and GERAN. Of course, other multiple access schemes and wireless protocols may be utilized.

The RANs 1920a-1920b are in communication with the core network 1930 to provide the EDs 1910a-1910c with various services such as voice, data, and other services. The RANs 1920a-1920b and/or the core network 1930 may be in direct or indirect communication with one or more other RANs (not shown), which may or may not be directly served by core network 1930, and may or may not employ the same radio access technology as RAN 1920a, RAN 1920b or both. The core network 1930 may also serve as a gateway access between (i) the RANs 1920a-1920b or EDs 1910a-1910c or both, and (ii) other networks (such as the PSTN 1940, the internet 1950, and the other networks 1960). In addition, some or all of the EDs 1910a-1910c may include functionality for communicating with different wireless networks over different wireless links using different wireless technologies and/or protocols. Instead of wireless communication (or in addition thereto), the EDs 1910a-1910c may communicate via wired communication channels to a service provider or switch (not shown), and to the internet 1950. PSTN 1940 may include circuit switched telephone networks for providing plain old telephone service (POTS). Internet 1950 may include a network of computers and subnets (intranets) or both, and incorporate protocols, such as IP, TCP, UDP. EDs 1910a-1910c may be multimode devices capable of operation according to multiple radio access technologies, and incorporate multiple transceivers necessary to support such radio access technologies.

Figure 20A:
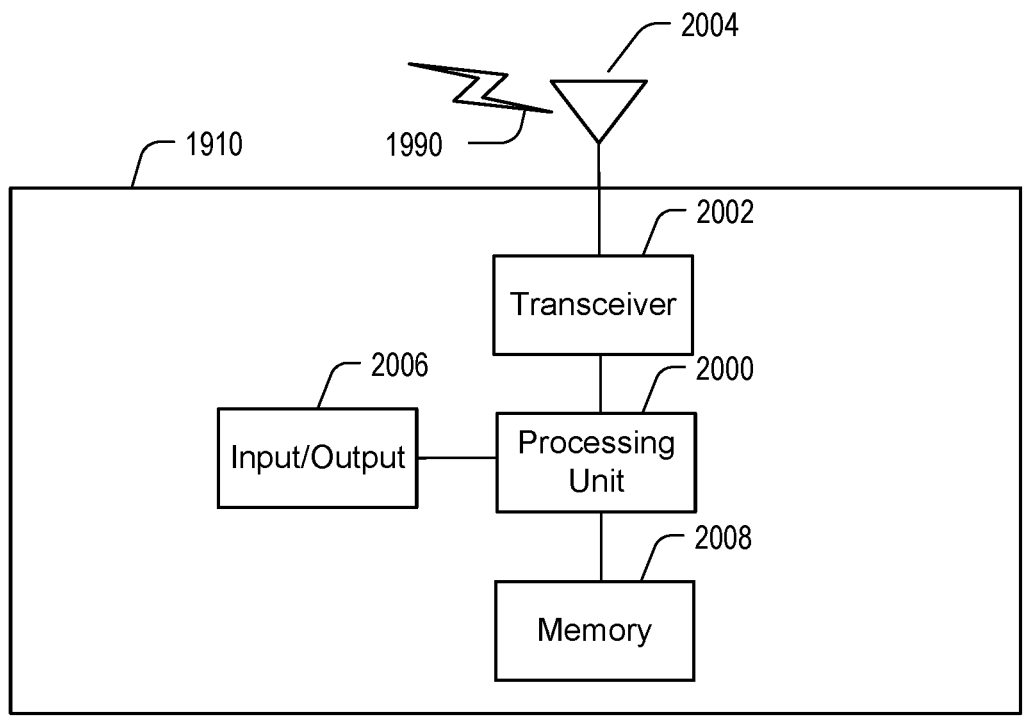
FIGS. 20A and 20B illustrate example devices that may implement the methods and teachings according to this disclosure.
Figure 20B:
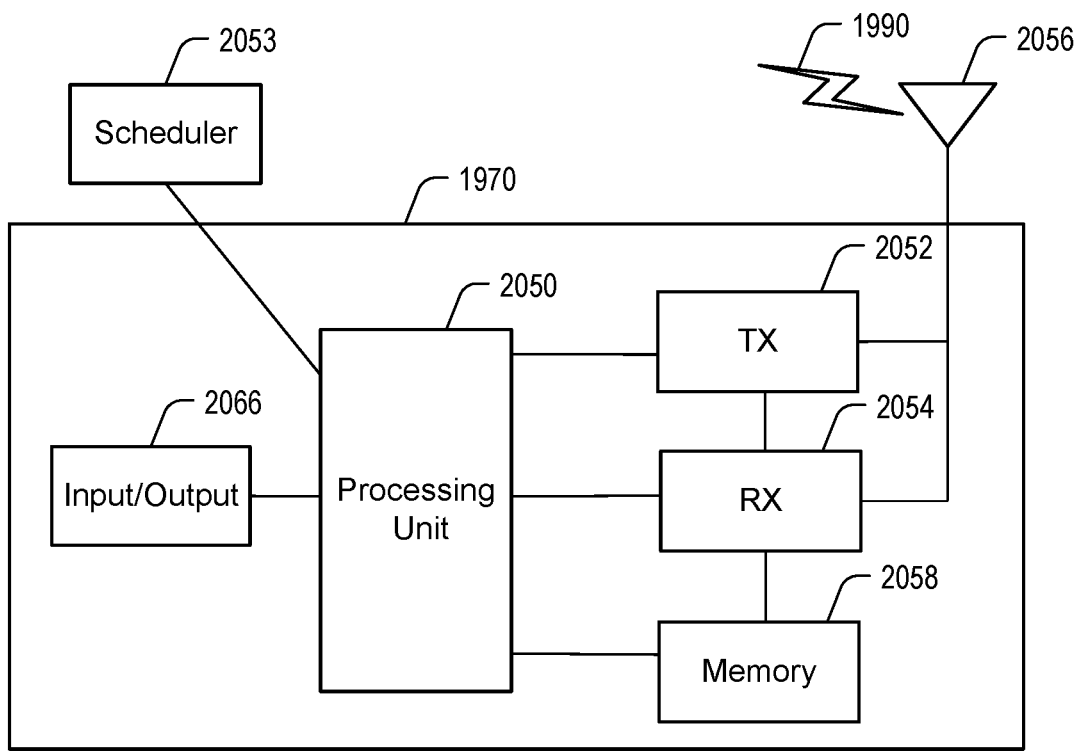

FIGS. 20A and 20B illustrate example devices that may implement the methods and teachings according to this disclosure. In particular, FIG. 20A illustrates an example ED 1910, and FIG. 20B illustrates an example base station 1970. These components could be used in the communication system 1900 or in any other suitable system.

As shown in FIG. 20A, the ED 1910 includes at least one processing unit 2000. The processing unit 2000 implements various processing operations of the ED 1910. For example, the processing unit 2000 could perform signal coding, data processing, power control, input/output processing, or any other functionality enabling the ED 1910 to operate in the communication system 1900. The processing unit 2000 may also be configured to implement some or all of the functionality and/or embodiments described in more detail above. Each processing unit 2000 includes any suitable processing or computing device configured to perform one or more operations. Each processing unit 2000 could, for example, include a microprocessor, microcontroller, digital signal processor, field programmable gate array, or application specific integrated circuit.

The ED 1910 also includes at least one transceiver 2002. The transceiver 2002 is configured to modulate data or other content for transmission by at least one antenna or Network Interface Controller (NIC) 2004. The transceiver 2002 is also configured to demodulate data or other content received by the at least one antenna 2004. Each transceiver 2002 includes any suitable structure for generating signals for wireless or wired transmission and/or processing signals received wirelessly or by wire. Each antenna 2004 includes any suitable structure for transmitting and/or receiving wireless or wired signals. One or multiple transceivers 2002 could be used in the ED 1910, and one or multiple antennas 2004 could be used in the ED 1910. Although shown as a single functional unit, a transceiver 2002 could also be implemented using at least one transmitter and at least one separate receiver.

The ED 1910 further includes one or more input/output devices 2006 or interfaces (such as a wired interface to the internet 1950). The input/output devices 2006 permit interaction with a user or other devices in the network. Each input/output device 2006 includes any suitable structure for providing information to or receiving information from a user, such as a speaker, microphone, keypad, keyboard, display, or touch screen, including network interface communications.

In addition, the ED 1910 includes at least one memory 2008. The memory 2008 stores instructions and data used, generated, or collected by the ED 1910. For example, the memory 2008 could store software instructions or modules configured to implement some or all of the functionality and/or embodiments described herein and that are executed by the processing unit(s) 2000. Each memory 2008 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 20B, the base station 1970 includes at least one processing unit 2050, at least one transmitter 2052, at least one receiver 2054, one or more antennas 2056, at least one memory 2058, and one or more input/output devices or interfaces 2066. A transceiver, not shown, may be used instead of the transmitter 2052 and receiver 2054. A scheduler 2053 may be coupled to the processing unit 2050. The scheduler 2053 may be included within or operated separately from the base station 1970. The processing unit 2050 implements various processing operations of the base station 1970, such as signal coding, data processing, power control, input/output processing, or any other functionality. The processing unit 2050 can also be configured to implement some or all of the functionality and/or embodiments described in more detail above. Each processing unit 2050 includes any suitable processing or computing device configured to perform one or more operations. Each processing unit 2050 could, for example, include a microprocessor, microcontroller, digital signal processor, field programmable gate array, or application specific integrated circuit.

Each transmitter 2052 includes any suitable structure for generating signals for wireless or wired transmission to one or more EDs or other devices. Each receiver 2054 includes any suitable structure for processing signals received wirelessly or by wire from one or more EDs or other devices. Although shown as separate components, at least one transmitter 2052 and at least one receiver 2054 could be combined into a transceiver. Each antenna 2056 includes any suitable structure for transmitting and/or receiving wireless or wired signals. Although a common antenna 2056 is shown here as being coupled to both the transmitter 2052 and the receiver 2054, one or more antennas 2056 could be coupled to the transmitter(s) 2052, and one or more separate antennas 2056 could be coupled to the receiver(s) 2054. Each memory 2058 includes any suitable volatile and/or non-volatile storage and retrieval device(s) such as those described above in connection to the ED 1910. The memory 2058 stores instructions and data used, generated, or collected by the base station 1970. For example, the memory 2058 could store software instructions or modules configured to implement some or all of the functionality and/or embodiments described above and that are executed by the processing unit(s) 2050.

Each input/output device 2066 permits interaction with a user or other devices in the network. Each input/output device 2066 includes any suitable structure for providing information to or receiving/providing information from a user, including network interface communications.

FIGS. 20A and 20B are illustrative of processor-based embodiments, in which an apparatus includes a processor in the form of a processing unit 2000 or 2050, and a memory 2008 or 2058 storing instructions which, when executed by the processor, cause the processor to perform a method as disclosed herein. The transceiver 2002 or the transmitter 2052 may enable a codeword to be transmitted, and the transceiver 2002 or the receiver 2054 may enable a codeword to be received, and accordingly an apparatus consistent with FIG. 20A or FIG. 20B may be operable to generate and transmit a codeword, receive and decode a codeword, or both generate and transmit a codeword and receive and decode a codeword.

Figure 21:
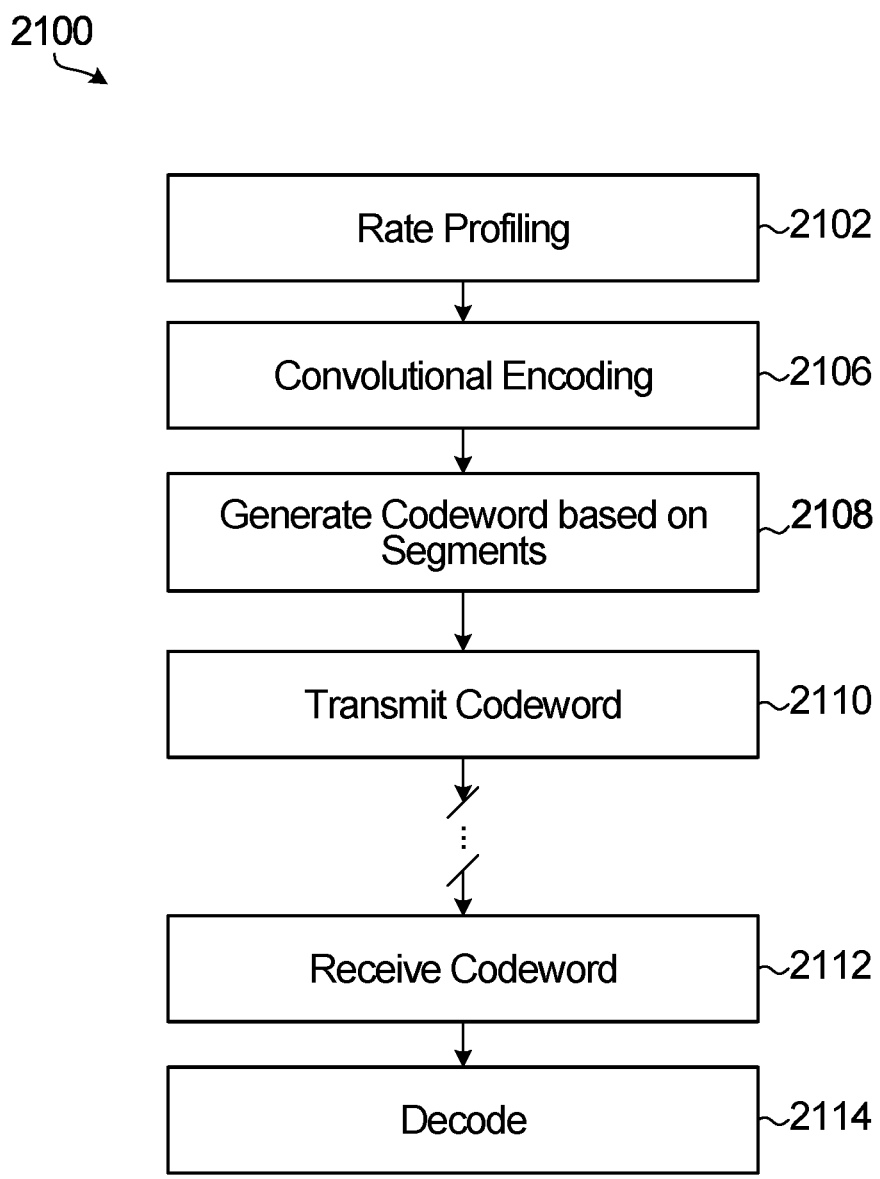
FIG. 21 is a flow diagram of an example coding method according to an embodiment.

FIG. 21 is a flow diagram of an example coding method according to an embodiment.

The example method 2100 includes operations that may be performed in some embodiments, and involves a segmentation transform and a PAC code that is based on an outer convolutional code and a polar code. The rate profiling at 2102 is part of polar coding and involves sub-channel selection as disclosed by way of example elsewhere herein. A PAC code also involves an outer convolutional code, and convolutional encoding is shown at 2106.

The example method 2100 also involves generating a codeword at 2108, based on the segmentation transform and the PAC code, and based on separate encoding of respective different segments of convolutionally encoded input bits according to the polar code. Each segment of the respective segments includes multiple bits of the convolutionally encoded input bits for which the separate encoding of the segment is independent of the separate encoding of other segments. A generated codeword may be stored and/or otherwise processed, and in the example method 2100 the codeword is transmitted at 2110.

Receive-side operations are also illustrated in FIG. 21. These operations include, in the example shown, receiving a codeword at 2112 and decoding the codeword at 2114. The codeword that is received at 2110 is based on a codeword that was generated based on a segmentation transform and a PAC code that includes an outer convolutional code and a polar code, and based on separately encoding respective different segments of convolutionally encoded input bits according to the polar code, with each segment of the respective segments including multiple bits of the convolutionally encoded input bits for which the separate encoding of the segment is independent of the separate encoding of other segments. The decoding at 2114 involves separately decoding segments of the received codeword to recover segments of convolutionally encoded input bits corresponding to the separately encoded segments of the convolutionally encoded input bits, and decoding the convolutionally encoded input bits recovered from the received codeword.

The example method 2100 is intended for illustrative purposes. Other embodiments could involve performing the illustrated operations in any of various ways, performing fewer or additional operations, and/or varying the order in which operations are performed. Other variations could be or become apparent to a skilled person based on the present disclosure.

For example, any one or more of the following could be provided, alone or in any of various combinations, in embodiments:

the segmentation transform involves interleaving the input bits before convolutional encoding at 2106 according to the outer convolutional code;

the interleaving involves interleaving of blocks of the input bits associated with the segments;

the interleaving involves bit interleaving;

the segmentation transform further involves combining convolutionally encoded input bits for the separate encoding of a segment;

the segmentation transform involves combining convolutionally encoded input bits for the separate encoding of a segment, without interleaving;

the combining without interleaving involves combining according to a reverse polar transform;

the outer convolutional code involves a non-zero initial state and state feedback;

generating a check code to enable checking of decoding of the codeword, checking of decoding of the convolutionally encoded input bits, or both checking of decoding of the codeword and checking of decoding of the convolutionally encoded input bits;

decoding features corresponding to any one or more of the features listed above or encoding features disclosed elsewhere herein.

Although FIG. 21 shows example operations that would be performed at an encoder (or transmitter), other embodiments could be implemented at a decoder (or receiver). A word that is based on a codeword of a code could be received at a receiver and decoded, based on sub-channels that are selected by the decoder, a sub-channel selector coupled to the decoder, or a processor in a processor-based embodiment, according to a method as shown in FIG. 21, and/or as otherwise disclosed herein.

In another embodiment, a non-transitory processor-readable medium stores instructions which, when executed by one or more processors, cause the one or more processors to perform a method as disclosed herein.

The previous description of some embodiments is provided to enable any person skilled in the art to make or use an apparatus, method, or processor readable medium according to the present disclosure.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code. Although the Arikan 2-by-2 binary kernel is used herein as an example, disclosed features may be extended to other types of polarization kernels.

The present disclosure refers primarily to a 2-by-2 kernel as example to demonstrate and explain illustrative embodiments. However, it is understood that the techniques for selecting sub-channels as disclosed herein could be applied to other types of polarization kernels as well, such as non-two prime number dimension kernels, non-primary dimension kernels, and/or higher dimension kernels formed by a combination of different (primary or non-primary) dimensions of kernels.

As noted above, polar codes have been selected for uplink and downlink eMBB control channel coding for the new 5G air interface, also known as 5G new radio (NR). The techniques disclosed herein could be used not only for control data over a control channel but also or instead over other types of data (e.g. user data) over any type of channel (e.g. a data channel).

Illustrative examples described herein refer to sub-channel sequences that are in increasing order of a reliability metric. In other embodiments, ordered sequences that are in decreasing reliability order could be used. Similarly, sequences could be generated in increasing order of reliability rather than starting with more reliable channels and building a sequence by adding sub-channels with progressively decreasing reliabilities.

The invention claimed is:

1. A method comprising:
selecting, by a sub-channel selector, sub-channels of a polar code to carry input bits, the polar code having mother code length N;
generating, by a Polarization-Assisted Convolutional (PAC) code encoder, a plurality of sub-codewords of an N-bit codeword based on a segmentation transform and a PAC code that comprises an outer convolutional code and the polar code, wherein the generating comprises generating the sub-codewords of the N-bit codeword by separately encoding respective different segments of convolutionally encoded input bits according to a polar code of mother code length less than N, each segment of the respective different segments comprising a plurality of the convolutionally encoded input bits for which the separate encoding of the segment is independent of the separate encoding of other segments of the respective different segments, wherein the segmentation transform comprises combining convolutionally encoded input bits for the separate encoding of a first segment of the respective different segments with other convolutionally encoded input bits for the separate encoding of a second segment of the respective different segments;
transmitting, by a transmitter, the codeword.

2. The method of claim 1, wherein the segmentation transform further comprises interleaving the input bits before convolutional encoding according to the outer convolutional code.

3. The method of claim 2, wherein the interleaving comprises interleaving of blocks of the input bits associated with the segments.

4. The method of claim 2, wherein the interleaving comprises bit interleaving.

5. The method of claim 1, wherein the combining comprises combining convolutionally encoded input bits according to a reverse polar transform.

6. The method of claim 1, wherein the outer convolutional code comprises a non-zero initial state and state feedback.

7. The method of claim 1, further comprising:
generating a check code to enable checking of decoding of the codeword, checking of decoding of the convolutionally encoded input bits, or both checking of decoding of the codeword and checking of decoding of the convolutionally encoded input bits.

8. A non-transitory processor-readable medium storing instructions which, when executed by one or more processors, cause the one or more processors to perform a method, the method comprising:
selecting, by a sub-channel selector, sub-channels of a polar code to carry input bits, the polar code having mother code length N;
generating, by a Polarization-Assisted Convolutional (PAC) code encoder, a plurality of sub-codewords of an N-bit codeword based on a segmentation transform and a PAC code that comprises an outer convolutional code and the polar code, wherein the generating comprises generating the sub-codewords of the N-bit codeword by separately encoding respective different segments of convolutionally encoded input bits according to a polar code of mother code length less than N, each segment of the respective different segments comprising a plurality of the convolutionally encoded input bits for which the separate encoding of the segment is independent of the separate encoding of other segments of the respective different segments, wherein the segmentation transform comprises combining convolutionally encoded input bits for the separate encoding of a first segment of the respective different segments with other convolutionally encoded input bits for the separate encoding of a second segment of the respective different segments;
transmitting, by a transmitter, the codeword.

9. The non-transitory processor-readable medium of claim 8, wherein the segmentation transform further comprises interleaving the input bits before convolutional encoding according to the outer convolutional code.

10. The non-transitory processor-readable medium of claim 9, wherein the interleaving comprises interleaving of blocks of the input bits associated with the segments, or bit interleaving.

11. The non-transitory processor-readable medium of claim 8, wherein the combining comprises combining convolutionally encoded input bits according to a reverse polar transform.

12. The non-transitory processor-readable medium of claim 8, wherein the outer convolutional code comprises a non-zero initial state and state feedback.

13. The non-transitory processor-readable medium of claim 8, the method further comprising:
   generating a check code to enable checking of decoding of the codeword, checking of decoding of the convolutionally encoded input bits, or both checking of decoding of the codeword and checking of decoding of the convolutionally encoded input bits.

14. An apparatus comprising:
   a sub-channel selector to select sub-channels of a polar code to carry input bits, the polar code having mother code length N;
   a Polarization-Assisted Convolutional (PAC) code encoder, coupled to the sub-channel selector, to generate a plurality of sub-codewords of an N-bit codeword based on a segmentation transform and a PAC code that comprises an outer convolutional code and the polar code, wherein the generating comprises generating the sub-codewords of the N-bit codeword by separately encoding respective different segments of convolutionally encoded input bits according to a polar code of mother code length less than N, each segment of the respective different segments comprising a plurality of the convolutionally encoded input bits for which the separate encoding of the segment is independent of the separate encoding of other segments of the respective different segments, wherein the segmentation transform comprises combining convolutionally encoded input bits for the separate encoding of a first segment of the respective different segments with other convolutionally encoded input bits for the separate encoding of a second segment of the respective different segments;
   a transmitter, coupled to the PAC code encoder, to transmit the codeword.

15. The apparatus of claim 14, wherein the segmentation transform further comprises interleaving the input bits before convolutional encoding according to the outer convolutional code.

16. The apparatus of claim 15, wherein the interleaving comprises interleaving of blocks of the input bits associated with the segments.

17. The apparatus of claim 15, wherein the interleaving comprises bit interleaving.

18. The apparatus of claim 14, wherein the combining comprises combining convolutionally encoded input bits according to a reverse polar transform.

19. The apparatus of claim 14, wherein the outer convolutional code comprises a non-zero initial state and state feedback.

20. The apparatus of claim 14, further comprising:
   a check code generator to generate a check code to enable checking of decoding of the codeword, checking of decoding of the convolutionally encoded input bits, or both checking of decoding of the codeword and checking of decoding of the convolutionally encoded input bits.

* * * * *

UNITED STATES PATENT AND TRADEMARK OFFICE
CERTIFICATE OF CORRECTION

| | |
|---|---|
| PATENT NO. | : 11,418,220 B2 |
| APPLICATION NO. | : 16/825319 |
| DATED | : August 16, 2022 |
| INVENTOR(S) | : Louis-Philippe Hamelin et al. |

It is certified that error appears in the above-identified patent and that said Letters Patent is hereby corrected as shown below:

On the Title Page

Under item (71) Applicants:
"Yiqun Ge, Kanata (AO)"
Should be:
-- Yiqun Ge, Kanata (CA) --

Under item (72) Inventors:
"Yiqun Ge, Kanata (AO)"
Should be:
-- Yiqun Ge, Kanata (CA) --

Signed and Sealed this
Third Day of January, 2023

Katherine Kelly Vidal
*Director of the United States Patent and Trademark Office*